United States Patent
Toyama

(10) Patent No.: US 8,648,373 B2
(45) Date of Patent: Feb. 11, 2014

(54) SEMICONDUCTOR LIGHT EMITTING DEVICE

(75) Inventor: Tomoichiro Toyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 146 days.

(21) Appl. No.: 13/289,288

(22) Filed: Nov. 4, 2011

(65) Prior Publication Data

US 2012/0112227 A1     May 10, 2012

(30) Foreign Application Priority Data

Nov. 5, 2010  (JP) ................ 2010-248494
Dec. 28, 2010 (JP) ................ 2010-292644
Sep. 29, 2011 (JP) ................ 2011-215534

(51) Int. Cl.
*H01L 33/00* (2010.01)

(52) U.S. Cl.
USPC .. 257/98; 257/99; 257/E33.062; 257/E33.072

(58) Field of Classification Search
USPC ............ 257/98, 99, E33.062, E33.072
See application file for complete search history.

(56) References Cited

U.S. PATENT DOCUMENTS

2003/0123504 A1*  7/2003  Liu et al. .............. 372/46

FOREIGN PATENT DOCUMENTS

JP    2004-119743    4/2004
JP    2006-245231    9/2006

* cited by examiner

*Primary Examiner* — David S Blum
(74) *Attorney, Agent, or Firm* — Hamre, Schumann, Mueller & Larson, P.C.

(57) ABSTRACT

A semiconductor light emitting device includes an LED chip, which includes an n-type semiconductor layer, active layer, and p-type semiconductor layer stacked on a substrate. The LED chip further includes an anode electrode connected to the p-type semiconductor, and a cathode connected to the n-type semiconductor. The anode and cathode electrodes face a case with the LED chip mounted thereon. The case includes a base member including front and rear surfaces, and wirings including a front surface layer having anode and cathode pads formed at the front surface, a rear surface layer having anode and cathode mounting electrodes formed at the rear surface, an anode through wiring connecting the anode pad and the anode mounting electrode and passing through a portion of the base member, and a cathode through wirings connecting the cathode pad and the cathode mounting electrode and passing through a portion of the base member.

22 Claims, 16 Drawing Sheets

SEMICONDUCTOR LIGHT EMITTING DEVICE

CROSS-REFERENCE TO RELATED APPLICATIONS

This application is based upon and claims the benefit of priority from Japanese Patent Application Nos. 2010-248494, 2010-292644 and 2011-215534, filed on Nov. 5, 2010, Dec. 28, 2010 and Sep. 29, 2011, respectively, the entire contents of which are incorporated herein by reference.

TECHNICAL FIELD

The present disclosure relates to a semiconductor light emitting device.

BACKGROUND

FIG. 27 illustrates an example of a conventional semiconductor light emitting device. In a semiconductor light emitting device 9 of the same drawing, a lead 92 is formed at a base member 91. A Light Emitting Diode (LED) chip 93 is mounted on the lead 92. The LED chip 93 includes a semiconductor layer 94 and a sub mount substrate 95. The semiconductor layer 94, for example, includes an n-type semiconductor layer, a p-type semiconductor layer, and an active layer disposed therebetween. The sub mount substrate 95 supports the semiconductor layer 94. The sub mount substrate 95 is formed of, for example, Si. The LED chip 93 is electrically connected to the lead 92 by a wire 96. A sealing resin 97 covers the LED chip 93, and transmits light from the LED chip 93.

When the LED chip 93 emits light, heat is mainly generated from the active layer. The heat is dissipated by being transferred to the lead 92 and the base member 91. However, the sub mount substrate 95 is interposed between the active layer and the lead 92. The sub mount substrate 95 prevents heat from being dissipated from the LED chip 93. Due to this reason, there is a problem in that light emission efficiency of the LED chip 93 is reduced.

FIG. 28 illustrates another example of a semiconductor light emitting device (for example, see Japanese Patent Application Laid-Open No. 2004-119743). In a semiconductor light emitting device 900 of the same drawing, an LED chip 902 is mounted on a base member 901. The LED chip 902 is surrounded by a reflector 905 having a frame shape. A space surrounded by the reflector 905 is filled with a sealing resin 906. The LED chip 902, for example, includes a sub mount substrate 903 formed of Si and a semiconductor layer 904 stacked on the sub mount substrate 903. The semiconductor layer 904 is electrically connected to the base member 901 through the sub mount substrate 903.

Light, emitted sideways from the LED chip 902, is reflected in an upward direction by the reflector 905. To emit more reflected light from the semiconductor light emitting device 900, an inner wall surface of the reflector 905 may be greatly inclined from an angle perpendicular to the substrate 901. However, as the inner wall surface is inclined, the semiconductor light emitting device 900 is enlarged. Miniaturizing of the semiconductor light emitting device 900 is strongly desired because electronic devices including the semiconductor light emitting device 900 have space restrictions. Due to this reason, it is difficult to simultaneously realize miniaturization and high luminance of the semiconductor light emitting device 900.

SUMMARY

The present disclosure provides some embodiments of a semiconductor light emitting device which facilitates the dissipation of heat from an LED chip, thus increasing light emission efficiency.

The present disclosure also provides some embodiments of a semiconductor light emitting device which can be miniaturized and have high luminance.

According to one aspect of the present disclosure, a semiconductor light emitting device includes: a plurality of LED chips; and a case on which the LED chips are mounted, wherein, each of the LED chips includes: a substrate; an n-type semiconductor layer; a p-type semiconductor layer; an active layer disposed between the n-type semiconductor layer and the p-type semiconductor layer; an anode electrode electrically connected to the p-type semiconductor; and a cathode electrically connected to the n-type semiconductor, the n-type semiconductor layer, the active layer, and the p-type semiconductor layer being stacked on the substrate, and the anode electrode and the cathode electrode facing the case when the LED chip is mounted on the case, and the case includes: a base member formed of ceramic, and including a front surface and a rear surface; and wirings including: a front surface layer including a plurality of anode pads and a plurality of cathode pads which are formed at the front surface; a rear surface layer including an anode mounting electrode and a cathode mounting electrode which are formed at the rear surface; a plurality of anode through wirings electrically connecting the anode pads and the anode mounting electrodes, and passing through at least a portion of the base member in a thickness direction of the base member; and a plurality of cathode through wirings electrically connecting the cathode pads and the cathode mounting electrodes, and passing through at least a portion of the base member in the thickness direction of the base member.

In one embodiment, the anode through wiring may include a plurality of full thickness anode through wirings passing through the base member from the front surface to the rear surface.

In one embodiment, the wirings may include an intermediate layer disposed between the front surface and the rear surface in the thickness direction of the base member.

In one embodiment, the cathode through wirings may include: one or more front surface side cathode through wirings passing through the base member from the front surface to the intermediate layer; and one or more rear surface side cathode through wirings passing through the base member from the intermediate layer to the rear surface.

In one embodiment, the intermediate layer may include a cathode relay wiring connected to the front surface side cathode through wiring and the rear surface side cathode through wiring.

In one embodiment, the front surface layer may include an anode plating wiring and a cathode plating wiring from one end of the base member to the other end of the base member, when seen in the thickness direction of the base member.

In one embodiment, the anode through wirings may include a plating anode through wiring connecting the anode plating wiring and the anode mounting electrode.

In one embodiment, the cathode through wirings may include a plating cathode through wiring connecting the cathode plating wiring and the cathode mounting electrode.

In one embodiment, one end surface of each anode through wirings is exposed at the front surface and covered by the anode pad.

In one embodiment, one end surface of each cathode through wirings is exposed at the front surface and covered by the cathode pad.

In one embodiment, the other end surface of each anode through wirings is exposed at the rear surface and covered by the anode mounting electrode.

In one embodiment, the other end surface of each cathode through wirings is exposed at the rear surface and covered by the cathode mounting electrode.

In one embodiment, the anode through wirings and the cathode through wirings may be formed of Ag.

In one embodiment, the anode pads and the cathode pads may be formed of Au.

In one embodiment, the anode mounting electrode and the cathode mounting electrode may be formed of Au.

In one embodiment, the wirings may include a bypass cathode pad and a bypass anode pad which are formed at the front surface, the anode through wirings may include a bypass cathode through wiring electrically connecting the bypass cathode pad and the anode mounting electrode, and the cathode through wirings may include a bypass anode through wiring electrically connecting the bypass anode pad and the cathode mounting electrode.

In one embodiment, a Zener diode may be electrically connected to the bypass cathode electrode, and the semiconductor light emitting device may include a wire electrically connecting the bypass anode pad and the Zener diode.

In one embodiment, a receiving concave portion receiving the LED chips may be formed in the case.

In one embodiment, a sealing resin covering the LED chips may be filled into the receiving concave portion.

In one embodiment, the sealing resin may be mixed with a phosphor material which is excited by light from the LED chip to emit light of a wavelength different from the light from the LED chip.

In one embodiment, the case may be approximately rectangular in shape when in a thickness direction of the base member, and a corner concave portion may be formed at each of four corners of the case, the corner concave portion having a quarter round sectional shape when seen in the thickness direction of the base member.

In one embodiment, the semiconductor light emitting device may further include: a first concave portion formed in at least one of the anode through wirings and the cathode through wirings; a second concave portion formed at the front surface layer to overlap with the first concave portion, when seen in the thickness direction of the base member; and a filling part filled into the second concave portion, wherein the filling part overlaps with any one of the LED chips when seen in the thickness direction of the base member.

In one embodiment, the semiconductor light emitting device may further include an adhesive part disposed between any one of the LED chips and the front surface layer, wherein the filling part is disposed between the adhesive part and the front surface layer, and contacts both the adhesive part and the front surface layer.

In one embodiment, the filling part may be formed of a conductive material.

In one embodiment, the filling part may be formed of an alloy of Au and Sn.

In one embodiment, the adhesive part may be formed of a conductive material.

In one embodiment, the adhesive part may be formed of an alloy of Au and Sn.

According to another aspect of the present disclosure, a semiconductor light emitting device includes: one or more LED chips; and a case including a front surface on which the LED chip is mounted, and a rear surface opposite to the front surface, wherein the case further includes: a base member having an inner wall surface surrounding the LED chip; and a reflective resin having: an internal edge disposed at the LED chip side; an external edge contacting the inner wall surface; and a reflective surface connecting the internal edge and the external edge, and the reflective surface being inclined to be gradually receded from the front surface from the internal edge to the external edge.

In one embodiment, the reflective resin may have a reflectivity higher than that of the base member.

In one embodiment, the reflective resin may be a white resin.

In one embodiment, the base member may be formed of ceramic.

In one embodiment, the case may be electrically connected to the LED chip, and include a lead, at least a portion of the lead being covered by the base member, and the base member may include thermosetting resin or thermoplastic resin.

In one embodiment, a height from the front surface to the external edge may be greater than a height from the front surface to an active layer of the LED chip.

In one embodiment, the inner wall surface may be perpendicular to the front surface.

In one embodiment, the semiconductor light emitting device may include a bypass function element preventing a reverse overvoltage from being applied to the LED chip, the reflective resin covering the bypass function element.

In one embodiment, the reflective resin may cover a wire connected to the bypass function element.

In one embodiment, the base member may be recessed from the front surface toward the rear surface, and include a stopping concave portion separated from the LED chip and configured to receive the bypass function element.

In one embodiment, the internal edge may be matched with an end edge of the stopping concave portion.

In one embodiment, the stopping concave portion may receive a pad which is bonded to the wire connected to the bypass function element.

In one embodiment, the stopping concave portion may include a surrounding portion surrounding the LED chip.

In one embodiment, the semiconductor light emitting device may include a plurality of the LED chips, wherein the reflective resin includes a protruding portion disposed between the LED chips adjacent to each other in the surrounding portion.

In one embodiment, the semiconductor light emitting device may include another LED chip disposed at a center of the case.

In one embodiment, the LED chip may have a flip chip type structure in which an anode electrode and a cathode electrode of the LED chip faces the front surface.

In one embodiment, the internal edge of the reflective resin may be separated from the LED chip.

In one embodiment, the LED chip may be disposed on the on an opposite side of the front surface, and have a 2-wire type structure in which an anode electrode and a cathode electrode of the LED chip are connected to a wire.

In one embodiment, the internal edge of the reflective resin may be separated from the LED chip.

In one embodiment, the case may include an anode pad and a cathode pad which are bonded to the wire connected to the LED chip, the anode pad and cathode pad being disposed outside the LED chip.

In one embodiment, the reflective resin may cover the anode pad and the cathode pad.

In one embodiment, the LED chip may include an n-type semiconductor layer, a p-type semiconductor layer, an active layer disposed between the n-type semiconductor layer and the p-type semiconductor layer, and a sub mount substrate supporting the layers, the n-type semiconductor layer, the active layer, the p-type semiconductor layer being stacked on the sub mount substrate.

In one embodiment, the reflective resin may cover an entire portion of the front surface surrounded by the inner wall surface other than a portion connected to the sub mount substrate.

In one embodiment, the semiconductor light emitting device may include a sealing resin covering the LED chip and the reflective resin, and formed of a material which is obtained by mixing a phosphor material with transparent resin which transmits light from the LED chip, the phosphor material being excited by light from the LED chip to emit light of a wavelength different from the light from the LED chip.

In one embodiment, the case may include: a front surface layer; a rear layer; a plurality of anode through wirings; and a plurality of cathode through wirings, the front surface layer may include a plurality of anode pads and cathode pads which are formed at the front surface of the base member, the rear layer may include an anode mounting electrode and a cathode mounting electrode which are formed at the rear surface of the base member, the anode through wirings may electrically connect the anode pads and the anode mounting electrodes, and pass through at least a portion of the base member in a thickness direction of the base member, and the cathode through wirings may electrically connect the cathode pads and the cathode mounting electrodes, and pass through at least a portion of the base member in the thickness direction of the base member.

In one embodiment, the semiconductor light emitting device may further include: a first concave portion formed in at least one of the anode through wirings and the cathode through wirings; a second concave portion formed at the front surface layer to overlap with the first concave portion, when seen in the thickness direction of the base member; and a filling part filled into the second concave portion, wherein the filling part overlaps with any one of the LED chips when seen in the thickness direction of the base member.

In one embodiment, the semiconductor light emitting device may further include an adhesive part disposed between any one of the LED chips and the front surface layer, wherein the filling part is disposed between the adhesive part and the front surface layer, and contacts both the adhesive part and the front surface layer.

In one embodiment, the filling part may be formed of a conductive material.

In one embodiment, the filling part may be formed of an alloy of Au and Sn.

In one embodiment, the adhesive part may be formed of a conductive material.

In one embodiment, the adhesive part may be formed of an alloy of Au and Sn.

Advantages and features of the present disclosure will be further clarified through a detailed description that is made below with reference to the accompanying drawings.

DETAILED DESCRIPTION

Embodiments of the present disclosure will now be described in detail with reference to the drawings.

Figure 1:
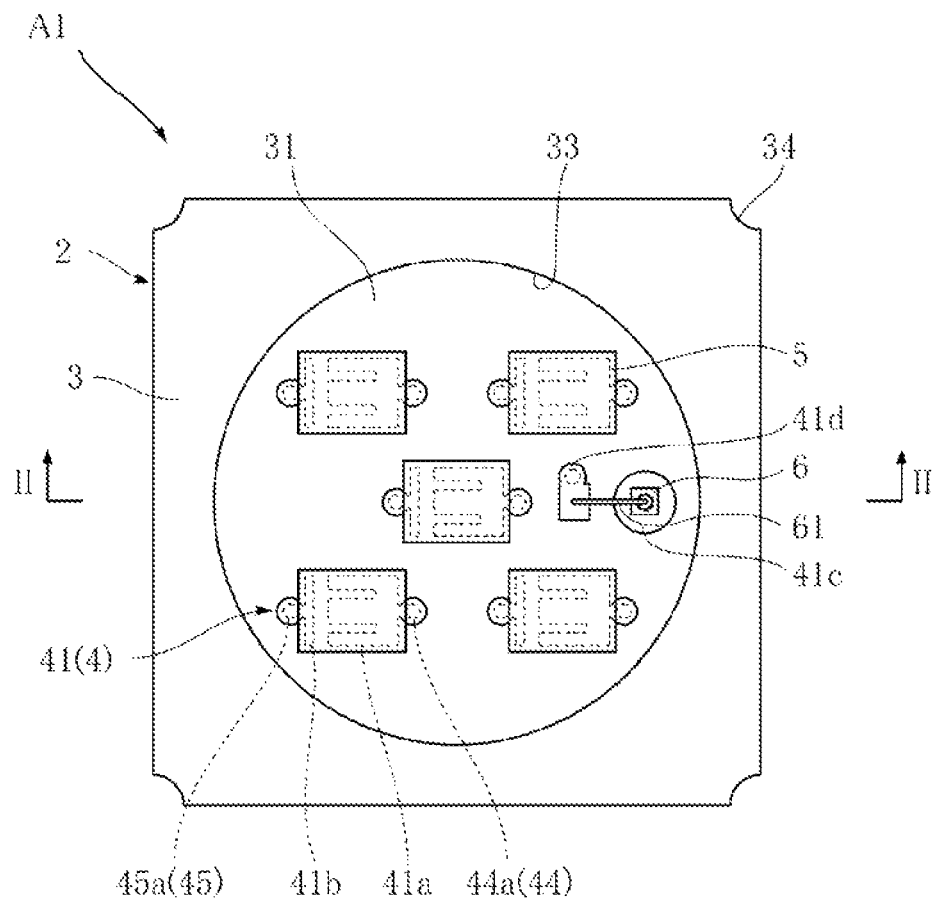
FIG. 1 is a plan view of a main part illustrating an example of a semiconductor light emitting device according to a first embodiment of the present disclosure.

FIGS. 1 to 6 illustrate an example of a semiconductor light emitting device according to a first embodiment of the present disclosure and an example of an LED chip applied thereto. A semiconductor light emitting device A1 according to the present embodiment includes a case 2, a plurality of LED chips 5, a Zener diode 6, and a sealing resin 7. In FIG. 1, the sealing resin 7 is not shown for convenience of illustrating.

The case 2 forms a base of the semiconductor light emitting device A1, and includes a base member 3 and wires 4. In size, the case 2 has a dimension of about 5 mm to about 10 mm and a thickness of about 1.0 mm.

The base member 3 may have a thick rectangular plate shape, and is formed of, for example, ceramic such as alumina. In the present embodiment, a material, which is called low temperature co-fired ceramic and has a relatively low firing temperature of about 900 degrees Celsius, is used as the ceramic. The low temperature co-fired ceramic may be fired together with a metal that is a material of the wirings 4, at a low firing temperature. A receiving concave portion 33 is formed at the center of the base member 3. The receiving concave portion 33 receives the LED chips 5, and has a circular shape. A corner concave portion 34 is formed at each of four corners of the base member 3. The corner concave portion 34 is a portion of a through hole that is formed for appropriately dividing a ceramic material during a process of manufacturing the semiconductor light emitting device A1, and is formed as a groove having a quarter round sectional shape. The base member 3 includes a front surface 31 and a rear surface 32. In the present embodiment, a depth of the receiving concave portion 33, for example, is about 0.6 mm.

The wirings 4 are used as a path for supplying Direct Current (DC) power to the LED chips 5, and include a front surface layer 41, an intermediate layer 42, a rear surface layer 43, a plurality of anode through wirings 44, and a plurality of cathode through wirings 45.

Figure 2:
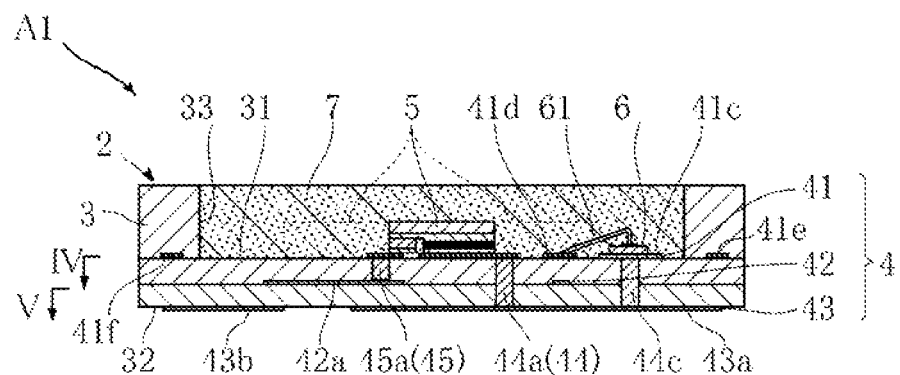
FIG. 2 is a sectional view taken along line II-II of FIG. 1.
Figure 4:
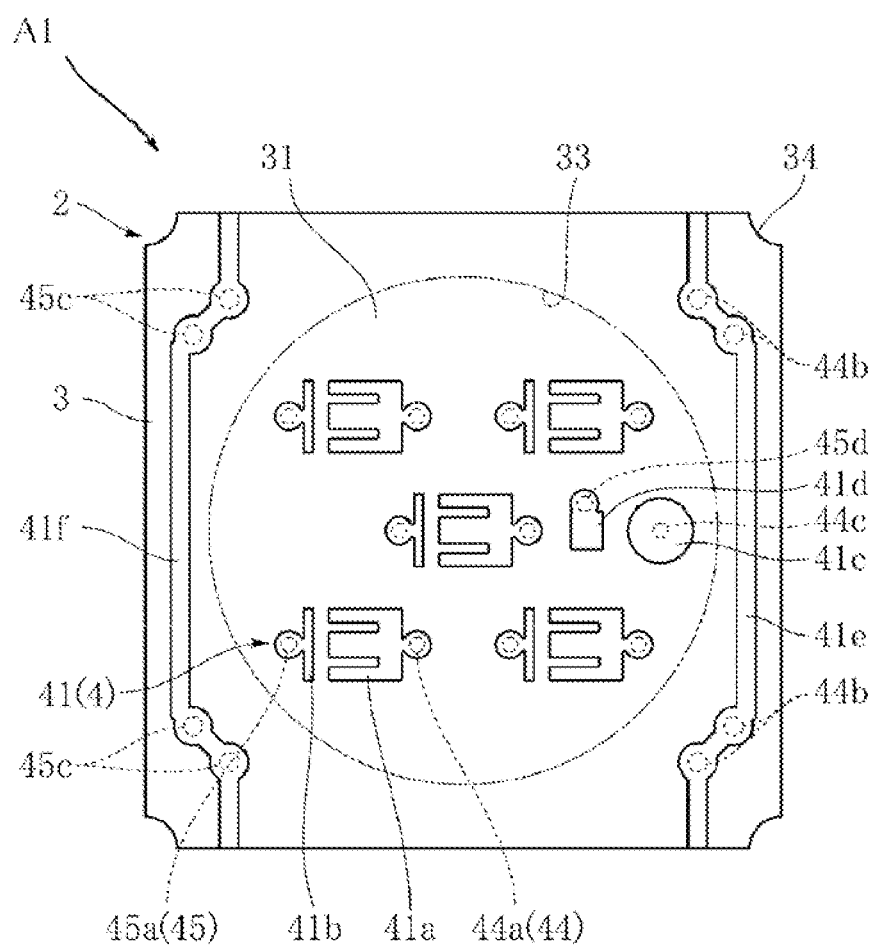
FIG. 4 is a plan view of a main part when it is assumed that the semiconductor light emitting device of FIG. 1 has been cut with respect to a plane taken along line IV-IV of FIG. 2.

FIG. 4 is a plan view of a main part when it is assumed that the semiconductor light emitting device A1 has been cut with respect to a plane taken along line IV-IV of FIG. 2. In the present disclosure, for convenience, portions of the wirings 4, which are formed on a circular area of the front surface 31 surrounded by the receiving concave portion 33 or on a layer which is disposed at the same vertical level as that of the front surface 31 in a thickness direction of the base member 3 are referred to as a front surface layer 41.

The front surface layer 41 includes a plurality of anode pads 41a, a plurality of cathode pads 41b, a bypass cathode pad 41c, a bypass anode pad 41d, an anode plating wiring 41e, and cathode plating wiring 41f. In the present embodiment, among the surface layer 41, a portion other than the anode plating wiring 41e and cathode plating wiring 41f is formed of Au, and the anode plating wiring 41e and cathode plating wiring 41f are formed of an appropriately selected metal including Au.

The anode pads 41a and the cathode pads 41b are for mounting the LED chips 5. As illustrated in FIG. 4, the anode pad 41a and the cathode pad 41b adjacent to each other are disposed as a set. In the present embodiment, five sets of the anode pad 41a and the cathode pad 41b are formed. Each of the anode pads 41a has three parallel branch-shaped portions, a band-shaped portion that is perpendicularly connected to the branch-shaped portions, and a circular portion connected to the band-shaped portion. The cathode pad 41b has a band-shaped portion and a circular portion connected to the band-shaped portion.

The bypass cathode pad 41c and bypass anode pad 41d are for mounting a bypass function element that prevents a reverse overvoltage from being applied to the LED chip 5. In the present embodiment, a Zener diode 6 is mounted as the bypass function element. The bypass cathode pad 41c is formed in a circular shape, and the bypass anode pad 41d has a rectangular portion and a circular portion connected to the rectangular portion.

The anode plating wiring 41e and cathode plating wiring 41f are used for forming the anode pads 41a, the cathode pads 41b, the bypass cathode pad 41c, the bypass anode pad 41d, and the rear surface layer 43 through plating. The anode plating wiring 41e and the cathode plating wiring 41f are extended from an upper end to a lower end of the base member 3 in FIG. 4, approximately parallel to each other.

Figure 5:
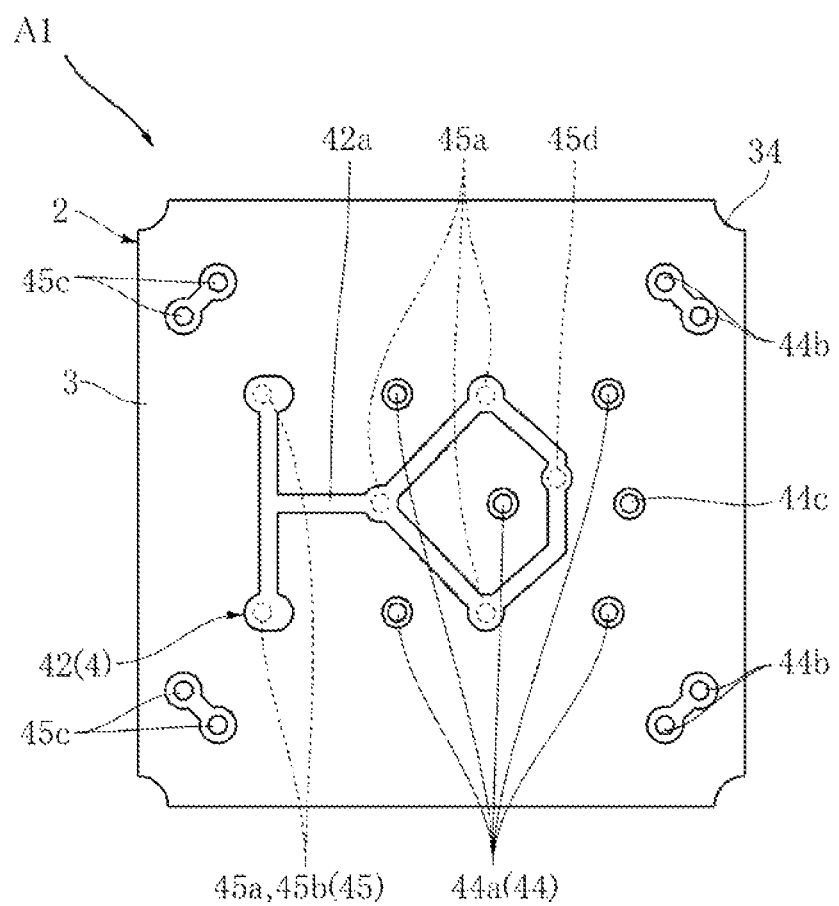
FIG. 5 is a plan view of a main part when it is assumed that the semiconductor light emitting device of FIG. 1 has been cut with respect to a plane taken along line V-V of FIG. 2.

The intermediate layer 42 is formed approximately in the center (at a depth of about 0.2 mm from the front surface 31) between the front surface 31 and the rear surface 32 in a thickness direction of the base member 3. FIG. 5 is a plan view of a main part when it is assumed that the semiconductor light emitting device A1 has been cut along a plane taken along line V-V of FIG. 2. As illustrated in FIG. 5, the intermediate layer 42 includes a cathode relay wiring 42a. The cathode relay wiring 42a has an approximately pentagonal portion, a first band-shaped portion connected to the pentagonal portion, and a second band-shaped portion that is perpendicularly connected to the first band-shaped portion.

Figure 6:
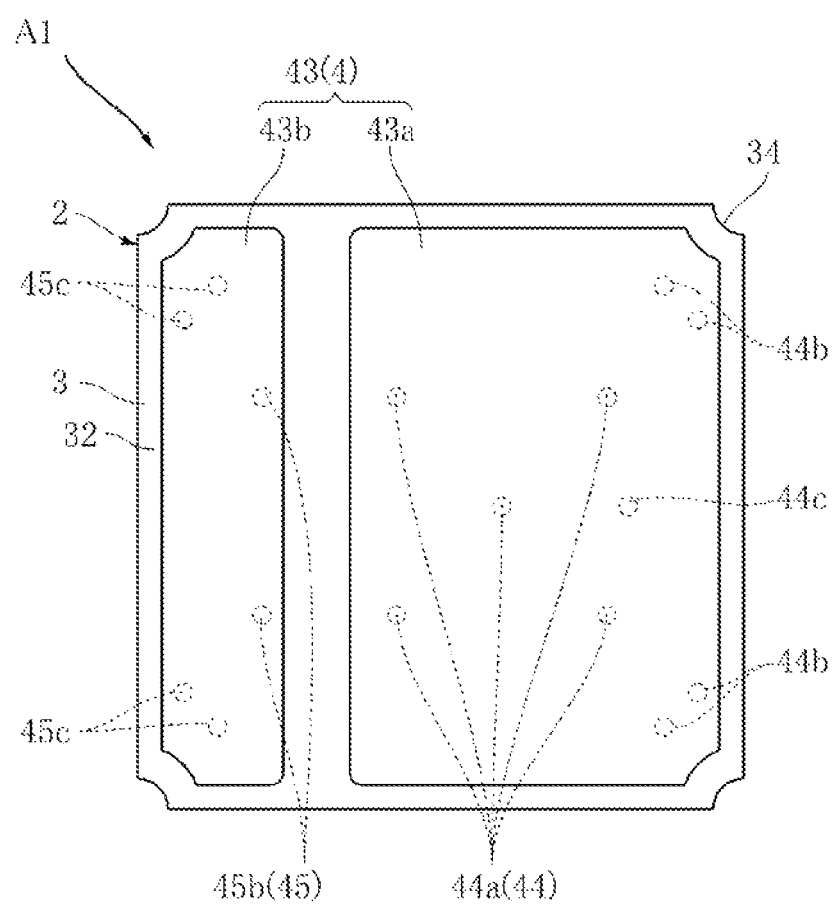
FIG. 6 is a bottom view illustrating the semiconductor light emitting device of FIG. 1.

As illustrated in FIG. 6, the rear surface layer 43 is formed at the rear surface 32 of the base member 3, and includes an anode mounting electrode 43a and a cathode mounting electrode 43b. The anode mounting electrode 43a and the cathode mounting electrode 43b are used for surface-mounting the semiconductor light emitting device A1, for example, on a circuit board or the like. In the present embodiment, the anode mounting electrode 43a and the cathode mounting electrode 43b are formed of Au. The anode mounting electrode 43a is approximately rectangular in shape, and covers approximately two-thirds of a right region of the rear surface 32 of the base member 3 in FIG. 6. The cathode mounting electrode 43b has an approximate rectangular shape, and covers approximately one-fourth of a left region of the rear surface 32.

The plurality of anode through wirings 44 include a plurality of full thickness anode through wirings 44a, a plurality of plating anode through wirings 44b, and a bypass cathode through wiring 44c. Each of the anode through wirings 44 may be formed of Ag, Ta, or soldering. In the present embodiment, each of the anode through wirings 44 is formed of Ag. As illustrated in FIG. 2, the full thickness anode through wirings 44a pass through the base member 3 from the front surface 31 to the rear surface 32 in a thickness direction thereof. As understood in FIGS. 4 and 6, the full thickness anode through wirings 44a are disposed in positions where the anode pad 41a and the anode mounting electrode 43a are overlapped when seen in a thickness direction of the base member 3. That is, in each full thickness anode through wiring 44a, an end surface of the anode through wiring 44a in the front surface 31 side is covered by the circular portion of the anode pad 41a, and an end surface of the anode through wiring 44a in the rear surface 32 side is covered by the anode mounting electrode 43a.

The plurality of plating anode through wirings 44b pass through the base member 3 in the thickness direction thereof just like the full thickness anode through wirings 44a. As understood in FIGS. 4 and 6, the plating anode through wirings 44b are disposed in positions where the anode plating wiring 41e and the anode mounting electrode 43a are overlapped when seen in the thickness direction of the base member 3. That is, in each plating anode through wiring 44b, an end surface in the front surface 31 side is covered by the anode plating wiring 41e, and an end surface in the rear surface 32 side is covered by the anode mounting electrode 43a.

The bypass cathode through wiring 44c passes through the base member 3 from the front surface 31 to the rear surface 32 in the thickness direction thereof, identically to the full thickness anode through wirings 44a. As understood in FIGS. 4 and 6, the bypass cathode through wiring 44c is disposed in positions where the bypass cathode pad 41c and the anode mounting electrode 43a are overlapped when seen in the thickness direction of the base member 3. That is, in the bypass cathode through wiring 44c, an end surface in the front surface 31 side is covered by the bypass cathode pad 41c, and an end surface in the rear surface 32 side is covered by the anode mounting electrode 43a.

The plurality of cathode through wirings 45 include a plurality of front surface side cathode through wirings 45a, a plurality of rear surface side cathode through wirings 45b, a plurality of plating cathode through wirings 45c, and a bypass anode through wiring 45d. In the present embodiment, the cathode through wirings 45 are formed of Ag. As illustrated in FIG. 2, the front surface side cathode through wiring 45a passes through a portion of the base member 3 from the front surface 31 to the intermediate layer 42 in the thickness direction thereof. As understood in FIGS. 4 and 5, the front surface side cathode through wirings 45a are disposed in positions where the cathode pads 41b and the cathode relay wiring 42a are overlapped when seen in the thickness direction of the base member 3. That is, in the front surface side cathode through wirings 45a, an end surface in the front surface 31 side is covered by the cathode pads 41b, and an end surface in the intermediate layer 42 side is covered by the cathode relay wiring 42a.

The plurality of rear surface side cathode through wirings 45b pass through a portion of the base member 3 from the intermediate layer 42 to the rear surface 32 in the thickness direction thereof. As understood in FIGS. 5 and 6, the rear surface side cathode through wirings 45b are disposed in positions where the cathode relay wiring 42a and the cathode mounting electrode 43b are overlapped when seen in the thickness direction of the base member 3. That is, in the rear surface side cathode through wirings 45b, an end surface in the intermediate layer 42 side is covered by the cathode relay wiring 42a, and an end surface in the rear surface 32 side is covered by the cathode mounting electrode 43b. Through the cathode relay wiring 42a of the intermediate layer 42, the front surface side cathode through wirings 45a and the rear surface side cathode through wirings 45b are electrically connected to each other.

The plurality of plating cathode through wirings 45c pass through the base member 3 in the thickness direction thereof just like the full thickness anode through wiring 44a. As understood in FIGS. 4 and 6, the plating cathode through wirings 45c are disposed in positions where the cathode plating wiring 41f and the cathode mounting electrode 43b are overlapped when seen in the thickness direction of the base member 3. That is, in each plating cathode through wiring 45c, an end surface in the front surface 31 side is covered by the cathode plating wiring 41f, and an end surface in the rear surface 32 side is covered by the cathode mounting electrode 43b.

The bypass anode through wiring 45d passes through the base member 3 from the front surface 31 to the intermediate layer 42, identically to the front surface side cathode through wiring 45a. As understood in FIGS. 4 and 5, the bypass anode through wiring 45d is disposed in a position where the bypass anode pad 41d and the anode relay wiring 42a are overlapped when seen in the thickness direction of the base member 3. That is, in the bypass anode through wiring 45d, an end surface in the front surface 31 side is covered by the bypass anode pad 41d, and an end surface in the intermediate layer 42 side is covered by the cathode relay wiring 42a.

Each of the LED chips 5, being a light source of the semiconductor light emitting device A1, has the following configuration. First, for example, an n-type semiconductor layer 5b formed of a GaN-based semiconductor is stacked on a substrate 5a formed of sapphire. Also, an active layer 5c is stacked on the n-type semiconductor layer 5b. The active layer 5c, for example, has a multi-quantum well structure where a plurality of layers formed of a GaN-based semiconductor are stacked. A p-type semiconductor layer 5d is stacked on the active layer 5c, for example, formed of a GaN-based semiconductor. An anode electrode Se is stacked on the p-type semiconductor layer 5d, for example, formed of a metal such as Al, Au, Ag, etc. A cathode electrode 5f is stacked on the n-type semiconductor layer 5b that is exposed by removing the p-type semiconductor layer 5d and active layer 5c through etching. The cathode electrode 5f is formed of, for example, a metal such as Al, Au, Ag, etc.

Each LED chip 5 is manufactured, and then mounted on the anode pad 41a and the cathode pad 41b by a predetermined mounting method such as a so-called flip chip type mounting method with inverted top and bottom. In detail, the anode electrode 5e is connected to the anode pad 41a through an adhesive part 51, and the cathode electrode 5f is connected to the cathode pad 41b through the adhesive part 51. Each LED chip 5 having such a configuration, for examples, emits blue light.

The Zener diode 6 is a functional element for preventing a reverse overvoltage from being applied to the LED chips 5. In the present embodiment, the Zener diode 6 is die-bonded to the bypass cathode pad 41c, and electrically connected to the bypass cathode pad 41c. Furthermore, the Zener diode 6 and the bypass anode pad 41d are connected to each other by a wire 61. Also, instead of the Zener diode 6, a varistor element or an Electro Static Discharge (ESD) protecting element may be used as the functional element for preventing the application of a reverse overvoltage.

The sealing resin 7 buries the receiving concave portion 33 of the case 2, and covers the LED chips 5. The sealing resin 7 is formed of a material that is obtained by mixing a phosphor material with a transparent epoxy resin or a silicon resin. The phosphor material, for example, is excited by blue light from the LED chip 5, thereby emitting yellow light. By combining the yellow light and the blue light, white light is emitted from the semiconductor light emitting device A1.

Next, an effect of the semiconductor light emitting device A1 will be described below.

Figure 3:
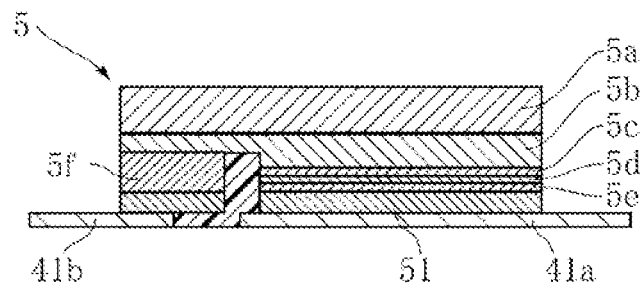
FIG. 3 is an enlarged sectional view of a main part illustrating an example of an LED chip which is applied to the semiconductor light emitting device of FIG. 1.

According to the present embodiment, as illustrated in FIGS. 2 and 3, the substrate 5a is not disposed between the active layer 5c and the case 2. Comparing the substrate 5a, the p-type semiconductor layer 5d is very thin, and the anode electrode 5e is formed of a metal having high thermal conductivity. Thus, heat generated from the LED chip 5 is readily transferred to the case 2. Accordingly, the dissipation of heat from the LED chip 5 can be facilitated, and the light emission efficiency of the LED chip 5 can increase.

The anode pad 41a is connected to the anode mounting electrode 43a through the full thickness anode through wiring 44a. Therefore, heat from the LED chip 5 is transferred to the anode mounting electrode 43a through the full thickness anode through wiring 44a, and moreover transferred to a circuit board with the semiconductor light emitting device A1 mounted thereon. This can facilitate the heat dissipation of the LED chip, thus increasing the light emission efficiency of the LED chip 5.

Moreover, the cathode pad 41b is connected to the cathode mounting electrode 43b through the front surface side cathode through wiring 45a, the cathode relay wiring 42a, and the rear surface side cathode through wiring 45b. Therefore, heat from the LED chip 5 is transferred to the cathode mounting electrode 43b through the front surface side cathode through wiring 45a, the cathode relay wiring 42a, and the rear surface side cathode through wiring 45b, and moreover transferred to the circuit board with the semiconductor light emitting device A1 mounted thereon. This can facilitate the heat dissipation of the LED chip, thus increasing the light emission efficiency of the LED chip 5.

The plurality of anode through wirings 44 and the plurality of cathode through wirings 45 are formed of Ag. This can easily facilitate the dissipation of heat from the LED chip 5. Also, in each of the anode through wirings 44 and the cathode through wirings 45, an end surface in the front surface 31 side and an end surface in the rear surface 32 side are covered by the front surface layer 41 and the rear surface layer 43, respectively. In the front surface layer 41 and the rear surface layer 43, at least portions covering the end surfaces of the anode through wirings 44 and the cathode through wirings 45 are formed of Au. Accordingly, the anode through wirings 44 and the cathode through wirings 45 formed of relatively degenerative Ag can be protected appropriately.

The base member 3 is formed of ceramic such as alumina, for example, which has a thermal expansion rate relatively close to that of a GaN-based semiconductor which is a material of the LED chip 5. Therefore, a thermal expansion difference hardly occurs between the LED chip 5 and the case 2 when mounting the LED chip 5 on the case 2, emitting light from the LED chip 5 or the like. Accordingly, the LED chip 5 can be prevented from abnormally being detached from the case 2.

The bypass cathode pad 41c is connected to the anode mounting electrode 43a through the bypass cathode through wiring 44c. This can allow a temporary high current to flow smoothly to prevent a reverse overvoltage from being applied to the LED chip 5.

Figure 7:
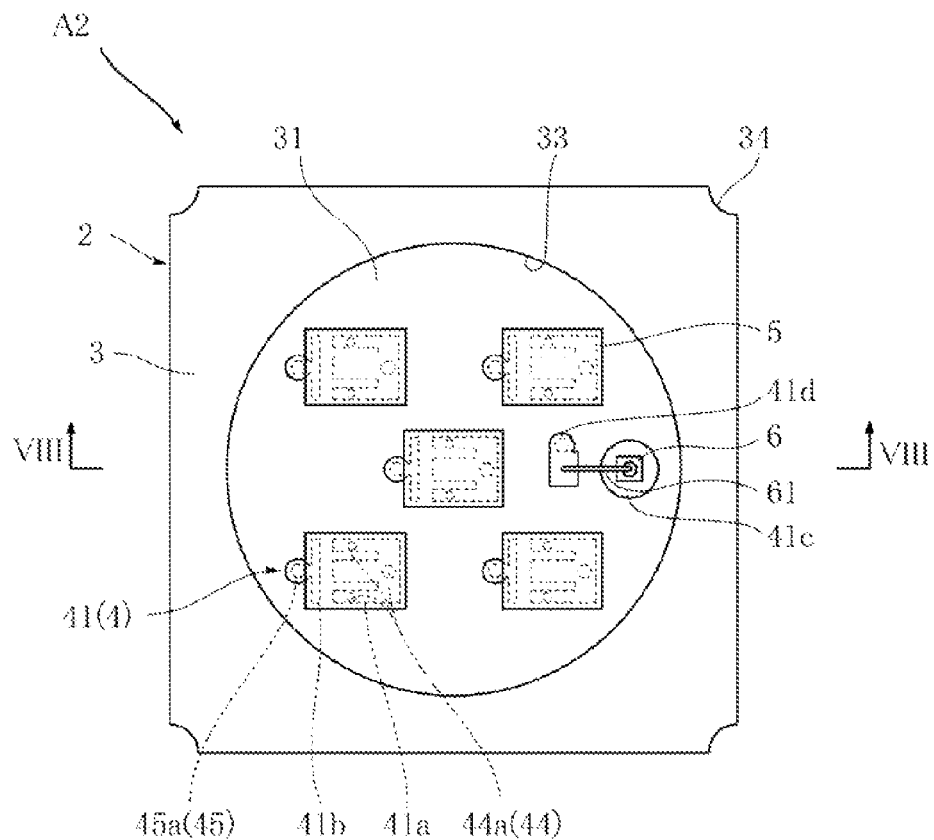
FIG. 7 is a plan view of a main part illustrating an example of a semiconductor light emitting device according to a second embodiment of the present disclosure.
Figure 8:
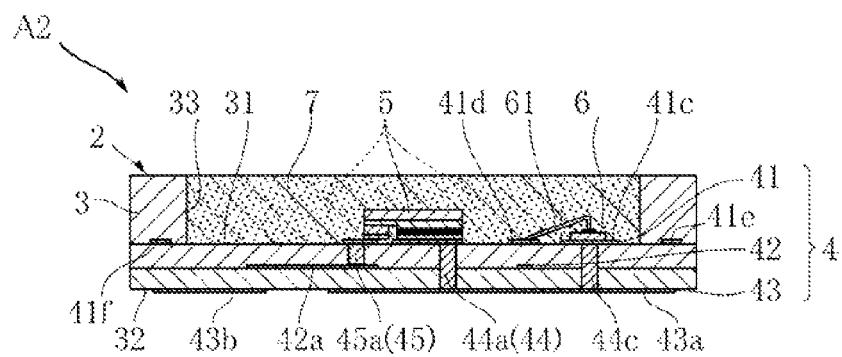
FIG. 8 is a sectional view taken along line VIII-VIII of FIG. 7.

A second embodiment of the present disclosure will be described below with reference to FIGS. 7 to 9.

Figure 9:
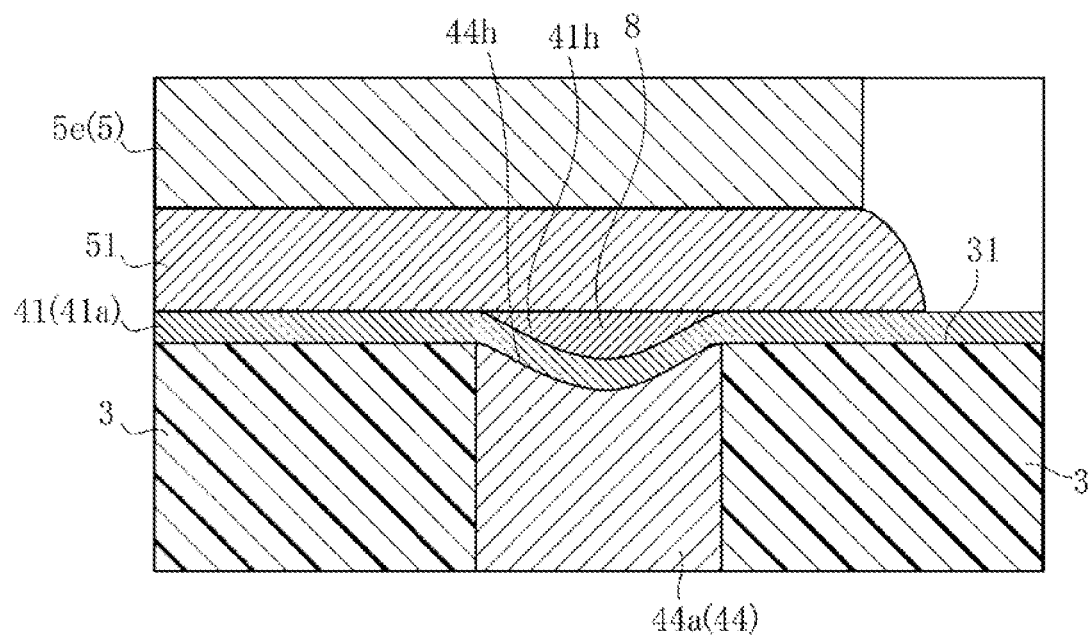
FIG. 9 is a partially enlarged sectional view illustrating an enlarged portion of the semiconductor light emitting device of FIG. 8.

A semiconductor light emitting device A2 in FIG. 9 differs from the semiconductor light emitting device A1 in that the former includes a filling part 8. A detailed description on this will be made below.

Although not illustrated in the description of the semiconductor light emitting device A1, actually, a concave portion recessed from the rear surface 32 of the base member 3 may be formed in the anode through wiring 44 or the cathode through wiring 45. The concave portion may be formed when firing the base member 3. In FIG. 9, a concave portion 44h is illustrated to be formed in the full thickness anode through wiring 44a among the anode through wirings 44. In the present embodiment, as illustrated in FIGS. 7 and 8, the LED chips 5 are respectively disposed at positions overlapped with the full thickness anode through wirings 44a.

Moreover, in the present embodiment, three full thickness anode through wirings 44a are formed at positions overlapped with one LED chip 5, but the number of the full thickness anode through wirings 44a overlapped with one LED chip 5 is not limited to three. The number of the full thickness anode through wirings 44a may be one, two, or four or more. As the number of the full thickness anode through wirings 44a increases, heat from the LED chip 5 can be more efficiently transferred to the anode mounting electrode 43a. This can facilitate the heat dissipation of the semiconductor light emitting device A2. Also, many full thickness anode through wirings 44a can decrease an electric resistance between the front surface layer 41 (anode pad 41a) and the anode mounting electrode 43a.

A surface defining the concave portion 44h is covered by the front surface layer 41. The front surface layer 41 has an almost conformal thickness. Therefore, a concave portion 41h is formed even in the front surface layer 41. The concave portion 41h of FIG. 9 is formed at the anode pad 41a of the front surface layer 41. The concave portion 41h is recessed toward the rear surface 32 of the base member 3. The concave portion 41h overlaps with the concave portion 44h when seen in the thickness direction of the base member 3. Thus, in FIG. 9, the concave portion 41h is disposed just on the concave portion 44h. Also, although not shown, in the present embodiment, the front surface layer 41 has a structure where a layer formed of Ni and a layer formed of Au are stacked. The layer formed of Ni is disposed between the layer formed of Au and the base member 3.

The concave portion 41h is filled with the filling part 8. The filling part 8 contacts the front surface layer 41 and the adhesive part 51. The filling part 8 may be formed of a conductive material or an insulating material. In the present embodiment, the filling part 8 is formed of a conductive material. As the conductive material forming the filling part 8, for example, an alloy of Au and Sn may be used. The filling part 8 is formed before disposing the LED chip 5 at the front surface layer 41 with the adhesive part 51. The filling part 8, for example, is formed by coating the concave portion 41h with a paste.

In the present embodiment, the adhesive part 51 is disposed between any one of the LED chips 5 and the front surface layer 41. The adhesive part 51 affixes each LED chip 5 to the front surface layer 41. The adhesive part 51 may be formed of a conductive material or an insulating material. In the present embodiment, the adhesive part 51 is formed of a conductive material. As the conductive material forming the adhesive part 51, for example, an alloy of Au and Sn may be used. Alternatively, the conductive material forming the adhesive part 51 may be a silver paste or soldering.

According to the semiconductor light emitting device A2, by forming the filling part 8 at the concave portion 41h before disposing the LED chip 5 on the base member 3, a surface of a portion for disposing the LED chip 5 can be better planarized. Therefore, even though the LED chip 5 is disposed at a position overlapped with the full thickness anode through wiring 44a when seen in the thickness direction of the base member 3, since the LED chip 5 is not sunken into the concave portion 41h, the position of the LED chip 5 can be prevented from being changed when disposing the LED chip 5. Accordingly, the manufacturing yield of the semiconductor light emitting device A2 can be enhanced.

Figure 10:
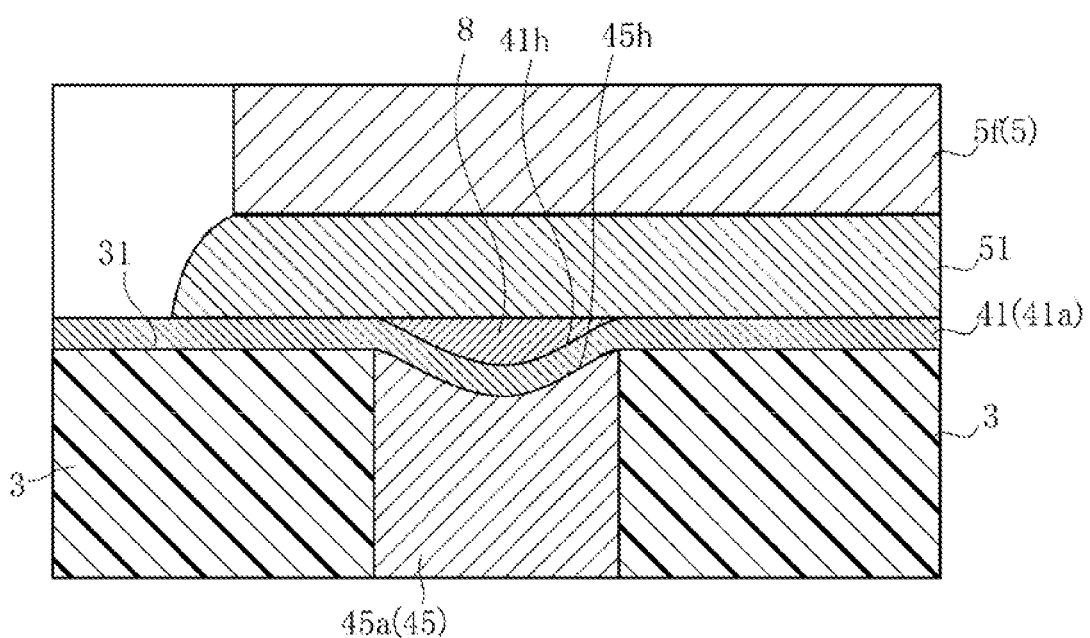
FIG. 10 is a partially enlarged sectional view of a semiconductor light emitting device according to a modified example of the second embodiment of the present disclosure.

Moreover, in FIG. 9, an example is illustrated where the concave portion 44h is formed at the anode through wiring 44, and the concave portion 41h is formed at the anode pad 41a of the front surface layer 41. Unlike the configuration illustrated in FIG. 9, in FIG. 10, a case is considered where a concave portion 45h is formed at the cathode through wiring 45, and the concave portion 41h is formed at a position overlapped with the concave portion 45h when seen in the thickness direction of the base member 3. In this case, the filling part 8 may be formed at the concave portion 41b, and the LED chip may be disposed at a position overlapped with the cathode through wiring 45 when seen in the thickness direction of the base member 3.

Figure 11:
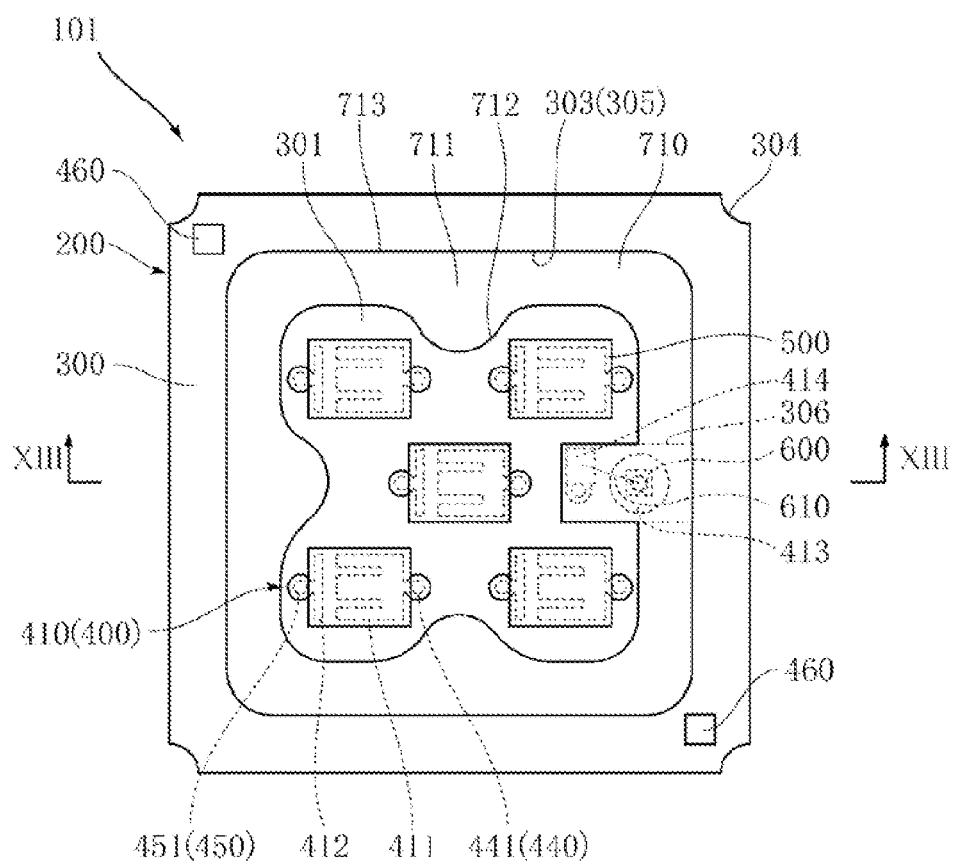
FIG. 11 is a plan view of a main part illustrating a semiconductor light emitting device according to a third embodiment of the present disclosure.
Figure 12:
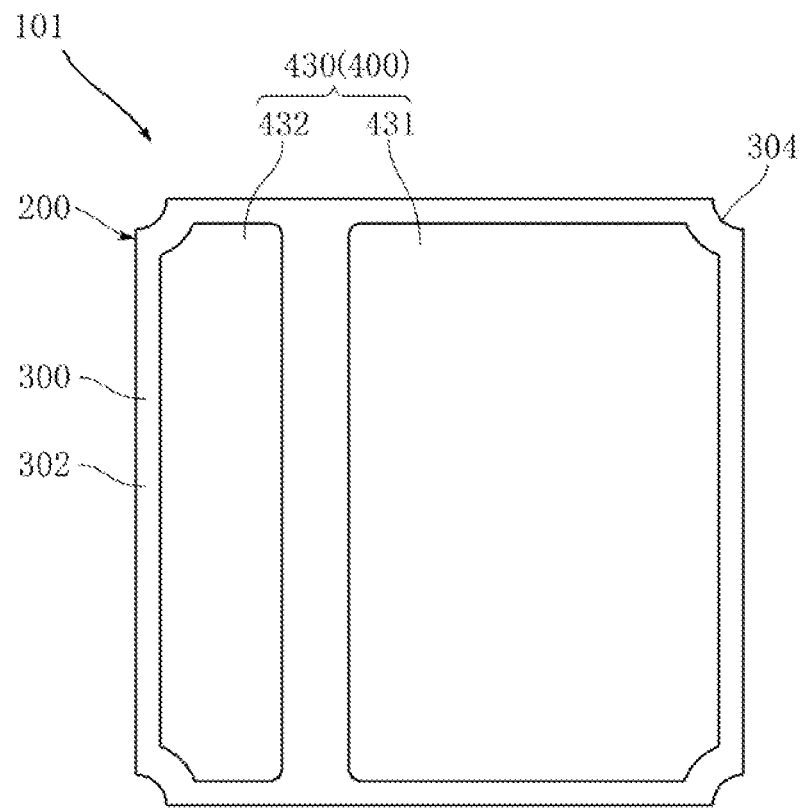
FIG. 12 is a bottom view illustrating the semiconductor light emitting device of FIG. 11.
Figure 13:
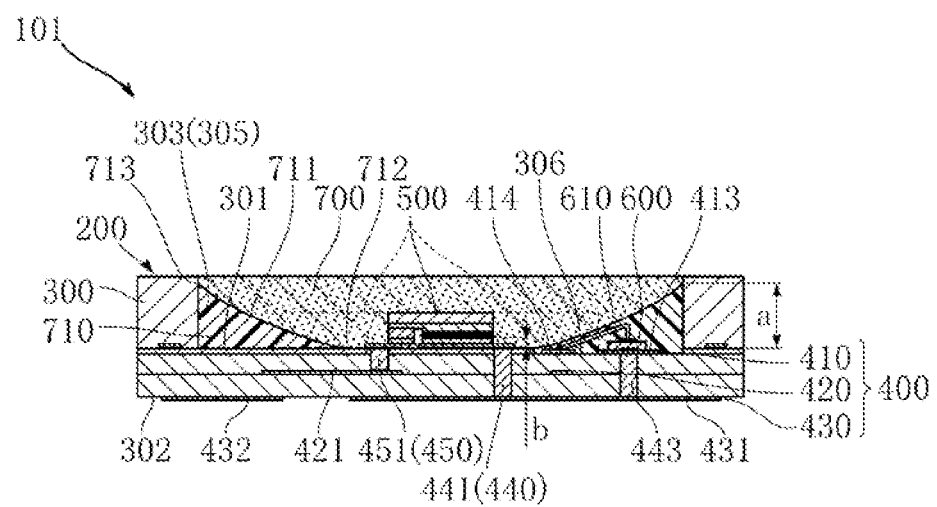
FIG. 13 is a sectional view taken along line XIII-XIII of FIG. 11.

FIGS. 11 to 13 illustrate a semiconductor light emitting device according to a third embodiment of the present disclosure. A semiconductor light emitting device 101 of the present embodiment includes a case 200, a plurality of LED chips 500, a Zener diode 600, a reflective resin 710, and a sealing resin 700. Also, in FIG. 11, the sealing resin 700 is not shown to simplify the illustration.

The case 200 forms the base of the semiconductor light emitting device 101, and includes a base member 300 and wires 400. In size, the case 200 has a dimension of about 5 mm to about 10 mm and a thickness of about 1.0 mm.

The base member 300 is formed in a rectangular plate shape, for example, formed of ceramic such as alumina. In the present embodiment, a material, which is called low temperature co-fired ceramic and has a relatively low firing temperature of about 900 degrees Celsius, is used as the ceramic. The low temperature co-fired ceramic may be fired together with a metal that is a material of wirings 400, at a low firing temperature.

A receiving concave portion 303 is formed at the center of the base member 300. The receiving concave portion 303 receives the LED chips 500, and has a rectangular shape. A corner concave portion 304 is formed at each of the four corners of the base member 300. The corner concave portion 304 is a portion of a through hole that is formed for appropriately dividing a ceramic material during a process of manufacturing the semiconductor light emitting device 101, and is formed as a groove having a quarter round sectional shape. The base member 300 includes a front surface 301 and a rear surface 302. An inner wall surface 305 of the receiving concave portion 303 has a ring shape and is perpendicular to the front surface 301. In the present embodiment, a depth of the receiving concave portion 303, for example, is about 0.6 mm.

The base member 300 includes a stopping concave portion 306. The stopping concave portion 306 is recessed from the front surface 301, and contacts the inner wall surface 305. In the present embodiment, the stopping concave portion 306 is rectangular in shape.

The wirings 400 are used as a path for supplying DC power to the LED chips 500, and includes a front surface layer 410, an intermediate layer 420, a rear surface layer 430, a plurality of anode through wirings 440, and a plurality of cathode through wirings 450.

The front surface layer 410 includes a plurality of anode pads 411, a plurality of cathode pads 412, a bypass cathode pad 413, and a bypass anode pad 414. The front surface layer 410, for example, is formed of Au.

The anode pads 411 and the cathode pads 412 are for mounting the LED chip 500. The anode pad 411 and the cathode pad 412 adjacent to each other are disposed as a set. In the present embodiment, five sets of the anode pad 411 and the cathode pad 412 are formed. Each of the anode pads 411 has three parallel branch-shaped portions, a band-shaped portion that is perpendicularly connected to the branch-shaped portions, and a circular portion connected to the band-shaped portion. The cathode pad 412 has a band-shaped portion and a circular portion connected to the band-shaped portion.

The bypass cathode pad 413 and the bypass anode pad 414 are for mounting a bypass function element that prevents a reverse overvoltage from being applied to the LED chip 500. In the present embodiment, a Zener diode 600 is mounted as the bypass function element. The bypass cathode pad 413 is circular in shape, and the bypass anode pad 414 has a rectangular portion and a circular portion connected to the rectangular portion.

The intermediate layer 420 is formed approximately in the center (a depth of about 0.2 mm from the front surface 301) between the front surface 301 and the rear surface 302 in a thickness direction of the base member 300. The intermediate layer 420 includes a cathode relay wiring 421.

As illustrated in FIG. 12, the rear surface layer 430 is formed at the rear surface 302 of the base member 300, and includes an anode mounting electrode 431 and a cathode mounting electrode 432. The anode mounting electrode 431 and the cathode mounting electrode 432 are used for surface-mounting the semiconductor light emitting device 101, for example, on a circuit board or the like. In the present embodiment, the anode mounting electrode 431 and the cathode mounting electrode 432 are formed of Au. The anode mounting electrode 431 is approximately rectangular in shape, and covers approximately two-thirds of a right region of the rear surface 302 of the base member 300 in FIG. 12. The cathode mounting electrode 432 is approximately rectangular in shape, and covers approximately one-fourth of a left region of the rear surface 302.

The plurality of anode through wirings 440 include a plurality of full thickness anode through wirings 441 and a bypass cathode through wiring 443. Each of the anode through wirings 440 may be formed of Ag, Ta, or soldering. In the present embodiment, each of the anode through wirings 440 is formed of Ag. As illustrated in FIG. 13, the full thickness anode through wirings 441 pass through the base member 300 from the front surface 301 to the rear surface 302 in the thickness direction thereof. In each full thickness anode through wiring 441, an end surface in the front surface 301 side is covered by the circular portion of the anode pad 411, and an end surface in the rear surface 302 side is covered by the anode mounting electrode 431.

The bypass cathode through wiring 443 passes through the base member 300 from the front surface 301 to the rear surface 302 in the thickness direction thereof, identically to the full thickness anode through wirings 441. In the bypass cathode through wiring 443, an end surface in the front surface 301 side is covered by the bypass cathode pad 413, and an end surface in the back surface 302 side is covered by the anode mounting electrode 431.

The plurality of cathode through wirings 450 include a plurality of front surface side cathode through wirings 451, a plurality of rear surface side cathode through wirings (not shown), and a bypass anode through wiring (not shown). In the present embodiment, the cathode through wirings 450 are formed of Ag. The front surface side cathode through wiring 451 passes through a portion of the base member 300 from the front surface 301 to the intermediate layer 420 in the thickness direction thereof. In the front surface side cathode through wirings 451, an end surface in the front surface 301 side is covered by the cathode pads 412, and an end surface in the intermediate layer 420 side is covered by the cathode relay wiring 421. The rear surface side cathode through wirings pass through a portion of the base member 300 from the intermediate layer 420 to the rear surface 302 in the thickness direction thereof. In the rear surface side cathode through wirings, an end surface in the intermediate layer 420 side is covered by the cathode relay wiring 421, and an end surface in the rear surface 302 side is covered by the cathode mounting electrode 432. Through the cathode relay wiring 421 of the intermediate layer 420, the front surface side cathode through wirings 451 and rear surface side cathode through wirings are electrically connected to each other. The bypass anode through wiring passes through the base member 300 from the front surface 301 to the intermediate layer 420, identically to the front surface side cathode through wiring 451. In the bypass anode through wiring, an end surface in the front surface 301 side is covered by the bypass anode pad 414, and an end surface in the intermediate layer 420 side is covered by the cathode relay wiring 421.

Two test electrodes 460 are formed at an uppermost surface of the base member 300. The test electrodes 460 are electrically connected to the anode pads 411 and the cathode pads 412. In a process of manufacturing the semiconductor light emitting device 101, by connecting a power supply probe for test to the two test electrodes 460, a test for lighting the LED chip 500 may be performed.

Figure 14:
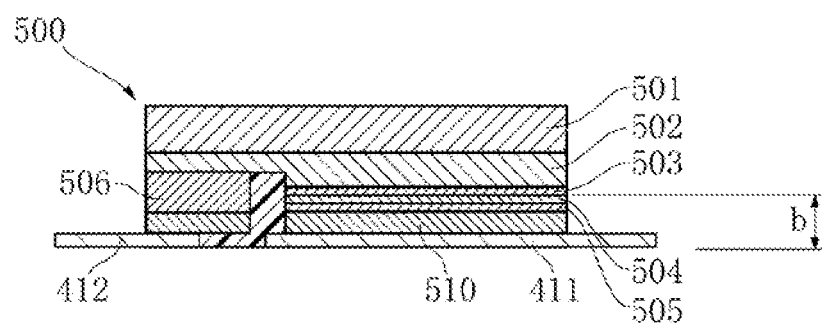
FIG. 14 is a sectional view illustrating an LED chip which is applied to the semiconductor light emitting device of FIG. 11.

Each of the LED chips 500, being a light source of the semiconductor light emitting device 101, has the following configuration. First, as illustrated in FIG. 14, for example, an n-type semiconductor layer 502 formed of a GaN-based semiconductor is stacked on a substrate 501 formed of sapphire. Also, an active layer 503 is stacked on the n-type semiconductor layer 502. The active layer 503, for example, has a multi-quantum well structure where a plurality of layers each formed of a GaN-based semiconductor are stacked. A p-type semiconductor layer 504 is stacked on the active layer 503, for example, formed of a GaN-based semiconductor. An anode electrode 505 is stacked on the p-type semiconductor layer 504, for example, formed of a metal such as Al, Au, Ag, etc. A cathode electrode 506 is stacked on the n-type semiconductor layer 502 that is exposed by removing the p-type semiconductor layer 504 and the active layer 503 through etching. The cathode electrode 506 is formed, for example, of a metal such as Al, Au, Ag, etc.

Each LED chip 500 is manufactured, and then mounted on the anode pad 411 and the cathode pad 412 by a predetermined mounting method such as a so-called flip chip type mounting method with inverted top and bottom. In detail, the anode electrode 505 is connected to the anode pad 411 through an adhesive part 510, and the cathode electrode 506 is connected to the cathode pad 412 through the adhesive part 510. Each LED chip 500 having such a configuration, for examples, emits blue light.

The Zener diode 600 is a functional element for preventing a reverse overvoltage from being applied to the LED chips 500. In the present embodiment, the Zener diode 600 is die-bonded to the bypass cathode pad 413, and electrically connected to the bypass cathode pad 413. Furthermore, the Zener diode 600 and the bypass anode pad 414 are connected to each other by a wire 610. The Zener diode 600, the bypass cathode 413, and the bypass anode pad 414 are formed in the stopping concave portion 306. Also, instead of the Zener diode 600, a varistor element or an ESD protecting element may be used as the functional element for preventing the application of a reverse overvoltage.

A reflective resin 710, for example, is formed of a material that is obtained by mixing silicon resin with oxide titanium, and has a clear white color. As illustrated in FIGS. 11 and 13, the reflective resin 710 includes an internal edge 712, an external edge 713, and a reflective surface 711. The internal edge 712 is separated from the LED chips 500 to surround the LED chips 500. The external edge 713 contacts the inner wall surface 305. The reflective surface 711 is a surface that connects the internal edge 712 and the external edge 713, and is formed as an inclined surface of which a height increases in a direction from the internal edge 712 to the external edge 713. The internal edge 712 contacts the front surface 301. Also, a height "a" from the front surface 301 to the external edge 713 is greater than a height "b" from the front surface 301 to the active layer 503 of the LED chip 500. The reflective resin 710 covers the Zener diode 600, the bypass cathode pad 413, the bypass anode pad 414, and the wire 610. A portion of the internal edge 712 is matched with a portion of an end edge of the stopping concave portion 306. The reflective resin 710, for example, may be formed by applying a resin material having appropriate viscosity to the front surface 301 and the stopping concave portion 306. By fluidity and surface tension of the resin material, the shape of the reflective resin 710 is realized.

The sealing resin 700 buries the receiving concave portion 303 of the case 200, and covers the LED chips 500 and the reflective resin 710. The sealing resin 700 is formed of a material that is obtained by mixing a phosphor material with a transparent epoxy resin or a silicon resin. The phosphor material, for example, is excited by blue light from the LED chip 500, thereby emitting yellow light. By combining the yellow light and the blue light, white light is emitted from the semiconductor light emitting device 101.

Next, an effect of the semiconductor light emitting device 101 will be described below.

According to the present embodiment, as illustrated in FIG. 13, the reflective surface 711 is disposed between the LED chip 500 and the inner wall surface 305. The reflective surface 711 is inclined such that a height from the front surface 301 increases gradually in a direction from the internal edge 712 of the LED chip 500 side to the external edge 713 contacting the inner wall surface 305. Therefore, light that is emitted sideways from the LED chip 500 can be appropriately reflected in an upward direction in the drawing. Also, the reflective surface 711 is formed by the reflective resin 710 formed in the receiving concave portion 303. Thus, by forming the reflective resin 710, the size of the case 200 is not enlarged. Accordingly, the miniaturization and high luminance of the semiconductor light emitting device 101 can be enhanced.

The reflective resin 710 is formed of a material which has a reflectivity higher than that of the ceramic material of the base member 300. Accordingly, the attenuation of light can be prevented when the light from the LED chip 500 is reflected by the reflective surface 711. By using white resin as the material of the reflective resin 710, the attenuation of light due to reflection can be prevented.

Figure 15:
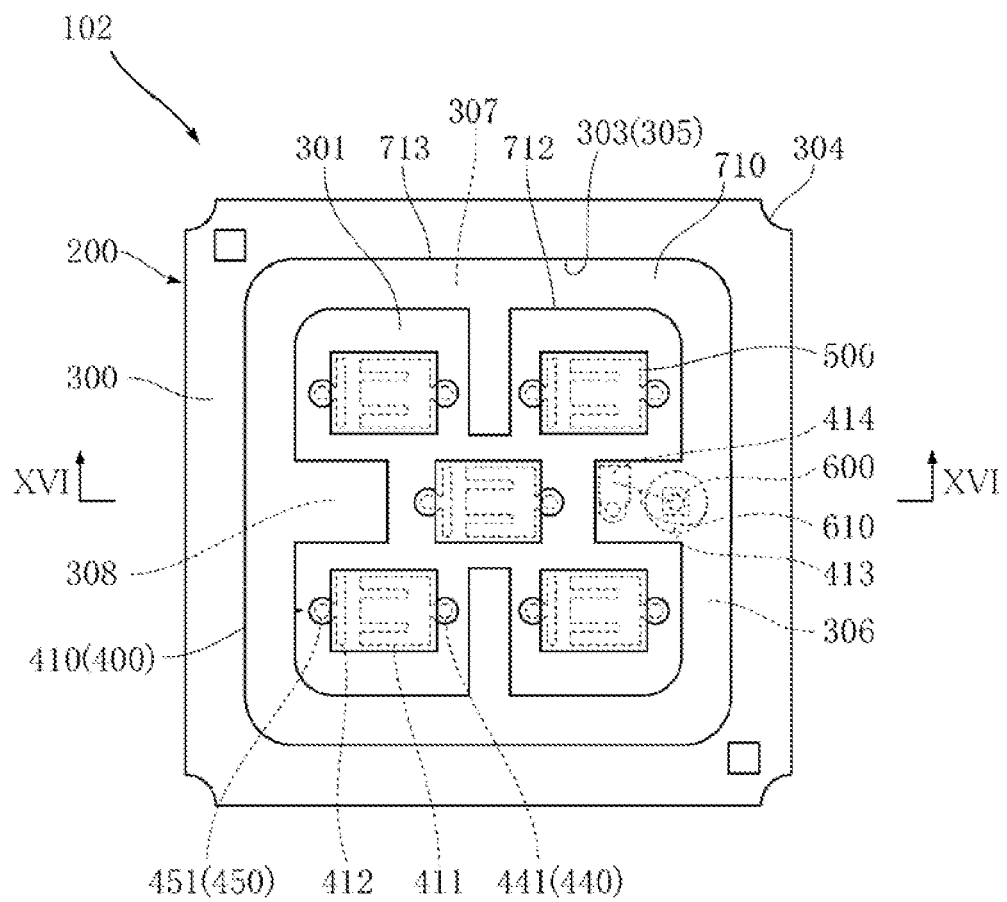
FIG. 15 is a plan view of a main part illustrating a semiconductor light emitting device according to a fourth embodiment of the present disclosure.

The active layer 503 is a light emitting portion in the LED chip 500. As illustrated in FIGS. 13 and 15, the height "a" from the front surface 301 to the external edge 713 is greater than the height "b" from the front surface 301 to the active layer 503. Therefore, the reflective surface 711 is disposed in front of the light that is emitted sideways from the active layer 503. Accordingly, the light that is emitted sideways from the active layer 503 can be efficiently reflected in an upward direction.

The inner wall surface 305 being perpendicular to the front surface 301 is favorable for miniaturizing of the case 200.

Generally, the Zener diode 600 absorbs relatively more light compared to the reflective resin 710 formed of white resin. By covering the Zener diode 600 with the reflective resin 710, light from the LED chip 500 is prevented from being absorbed into the Zener diode 600, and thus, the high luminance of the semiconductor light emitting device 101 can be further facilitated. By disposing the Zener diode 600 at the stopping concave portion 306, when applying a liquefied or pasty resin material to the stopping concave portion 306 in forming the reflective resin 710, the resin material can appropriately cover the Zener diode 600, and surface tension of the resin material can prevent the internal edge 712 from passing over the end edge of the stopping concave portion 306. This can facilitate high luminance, and prevent the reflective resin 710 from being attached to the active layer 503 of the LED chip 500.

FIGS. 15 to 22 illustrate other embodiments of the present disclosure. In the drawings, elements similar or equal to those of the above-described embodiments are indicated by the same reference numerals as those of the above-described embodiments.

Figure 16:
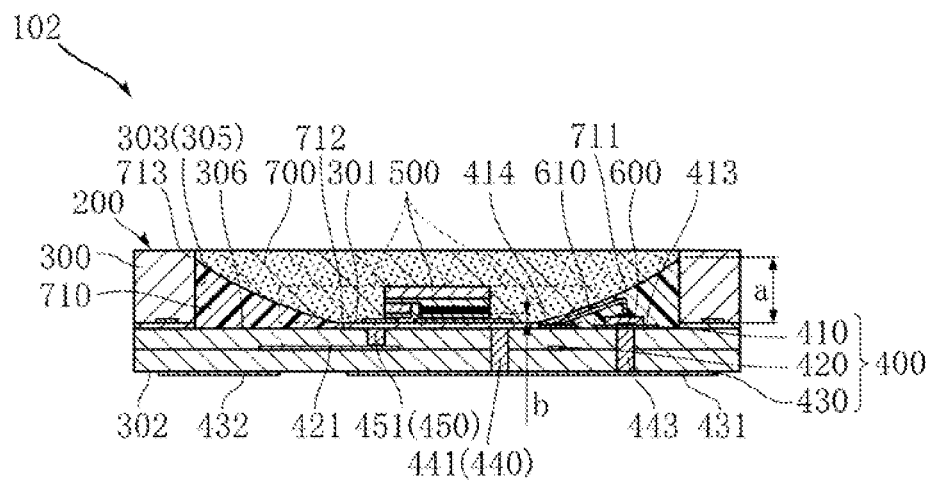
FIG. 16 is a sectional view taken along line XVI-XVI of FIG. 15.

FIGS. 15 and 16 illustrate a semiconductor light emitting device according to a fourth embodiment of the present disclosure. A semiconductor light emitting device 102 of the present embodiment differs from the above-described embodiments in configuration of a stopping concave portion 306.

In the present embodiment, the stopping concave portion 306 includes a surrounding portion 307 and protruding portions 308. The surrounding portion 307 has a ring shape along the inner wall surface 305, and surrounds a plurality of LED chips 500. The protruding portions 308 protrude from the surrounding portion 307 between LED chips 500 adjacent to each other. One LED chip 500 is disposed at a region near to the center of the case 200.

In the present embodiment, an entire internal edge 712 of a reflective resin 710 is matched with an end edge of the stopping concave portion 306. That is, the reflective resin 710 is formed at a position set back from a front surface 301.

By the present embodiment, high luminance and miniaturization of the semiconductor light emitting device 102 can be facilitated. Also, by forming the surrounding portion 307 at the stopping concave portion 306, the internal edge 712 of the reflective resin 710 is formed at a position closer to the LED chip 500, and moreover, a resin material can be prevented from becoming attached to the LED chip 500 when forming the reflective resin 710. By forming the protruding portions 308, the reflective resin 710 can be appropriately formed in a space between adjacent LED chips 500. A portion of a reflective surface 711 extended by the protruding portions 308 can efficiently reflect light from the LED chip 500.

Figure 17:
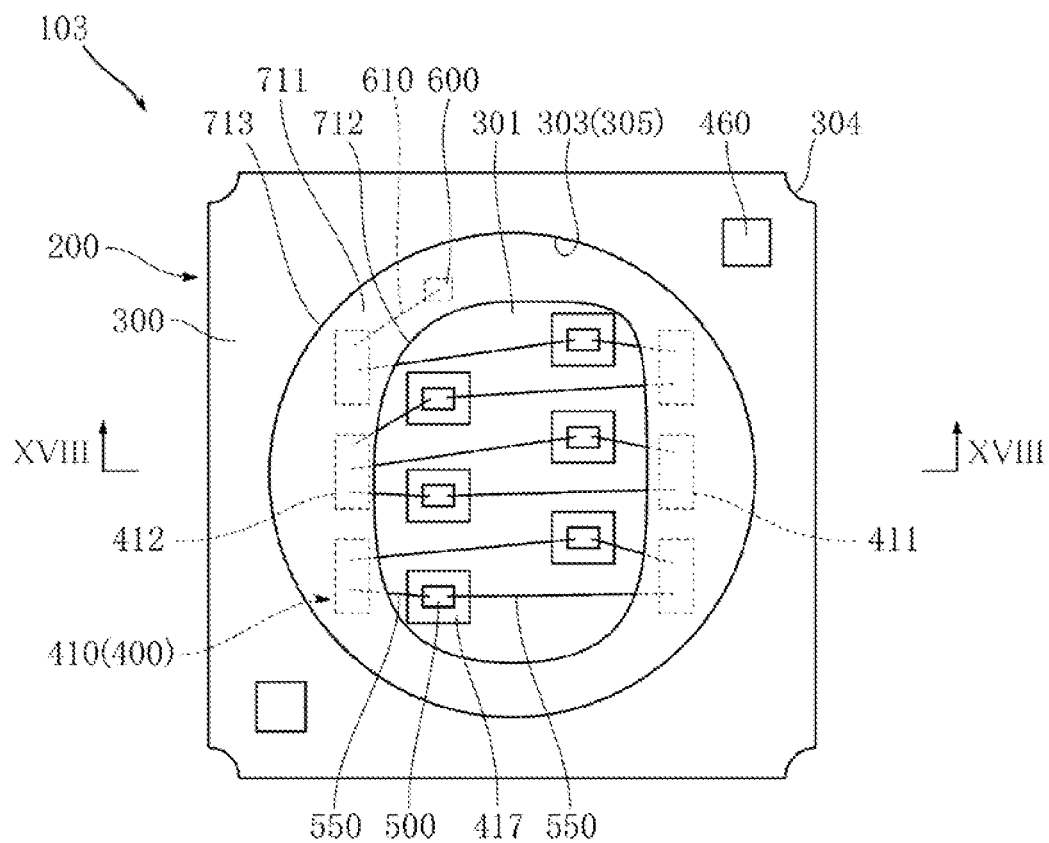
FIG. 17 is a plan view of a main part illustrating a semiconductor light emitting device according to a fifth embodiment of the present disclosure.
Figure 18:
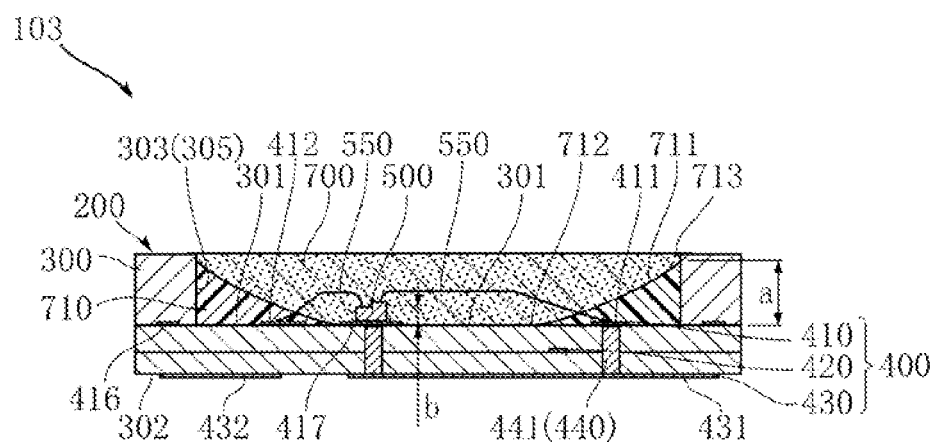
FIG. 18 is a sectional view taken along line XVIII-XVIII of FIG. 17.
Figure 19:
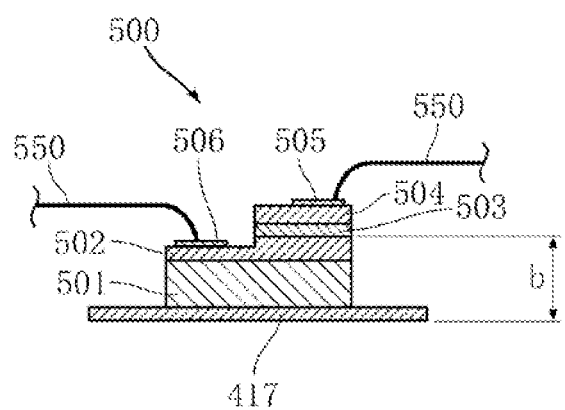
FIG. 19 is a sectional view illustrating an LED chip which is applied to the semiconductor light emitting device of FIG. 17.

FIGS. 17 and 18 illustrate a semiconductor light emitting device according to a fifth embodiment of the present disclosure. A semiconductor light emitting device 103 of the present embodiment mainly differs from the above-described embodiments in configuration of LED chips 500. In the present embodiment, as illustrated in FIG. 19, each of the LED chips 500 has an anode electrode 505 and a cathode electrode 506 formed at a top side. Wires 550 are connected to the anode electrode 505 and the cathode electrode 506. Such an LED chip 500 is a so-called 2-wire type.

As illustrated in FIG. 17, a receiving concave portion 303 is circular in shape when seen from a plane. A plurality of die bonding pads 417 are formed at a front surface 301. The LED chip 500 is die-bonded to the die bonding pad 417. A plurality of anode pads 411 and a plurality of cathode pads 412 are disposed with the die bonding pads 417 therebetween. One wire 550 of each LED chip 500 is connected to each anode pad 411, and the other wire 550 is connected to each cathode pad 412.

A reflective resin 710 covers the anode pads 411 and the cathode pads 412. Also, in the wire 550, a portion in the anode pads 411 side or in the cathode pads 412 side is covered by the reflective resin 710. An internal edge 712 is disposed at a position separated from the LED chips 500 and the die bonding pads 417, and thus, the reflective resin 710 surrounds the LED chips 500 and die bonding pads 417. The Zener diode 600 and the wire 610 are also covered by the reflective resin 710.

By such a configuration, high luminance and miniaturization of the semiconductor light emitting device 103 can be facilitated. Also, the anode pad 411 and the cathode pad 412 are disposed outside the LED chip 500. Therefore, all the wires 500 connected to the 2-wire type LED chip 500 are extended outward from the LED chip 500. Portions of the wires 550 boned to the anode pad 411 or the cathode pad 412 and portions adjacent thereto pull a resin material by surface tension when forming the reflective resin 710. Accordingly, the resin material can be positioned outside the LED chips 500.

Figure 20:
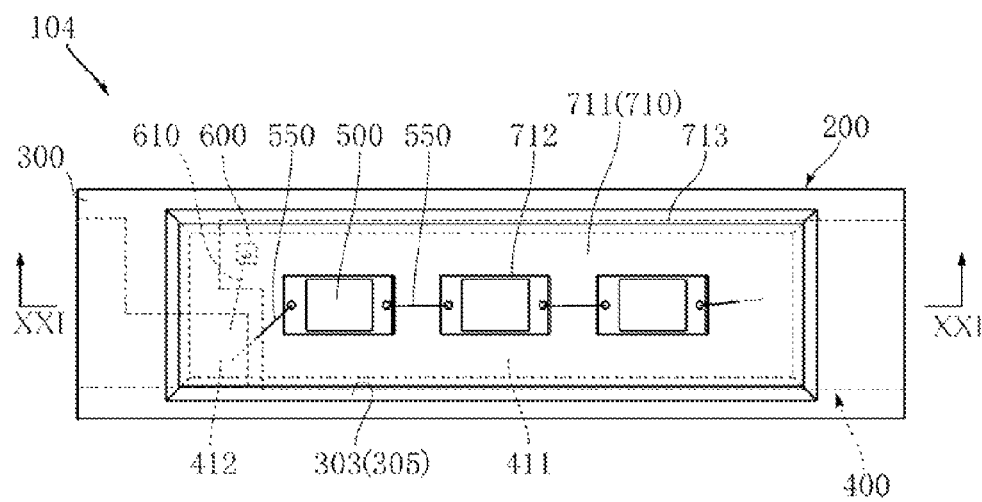
FIG. 20 is a plan view of a main part illustrating a semiconductor light emitting device according to a sixth embodiment of the present disclosure.
Figure 21:
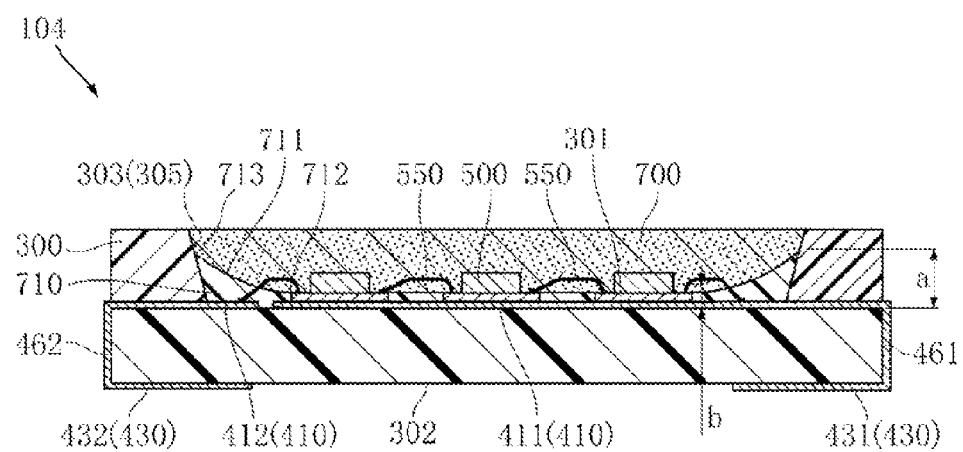
FIG. 21 is a sectional view taken along line XXI-XXI of FIG. 20.

FIGS. 20 and 21 illustrate a semiconductor light emitting device according to a sixth embodiment of the present disclosure. A semiconductor light emitting device 104 of the present embodiment mainly differs from the above-described embodiments in the entire configuration of the case 200 and structure of LED chip 500.

Figure 22:
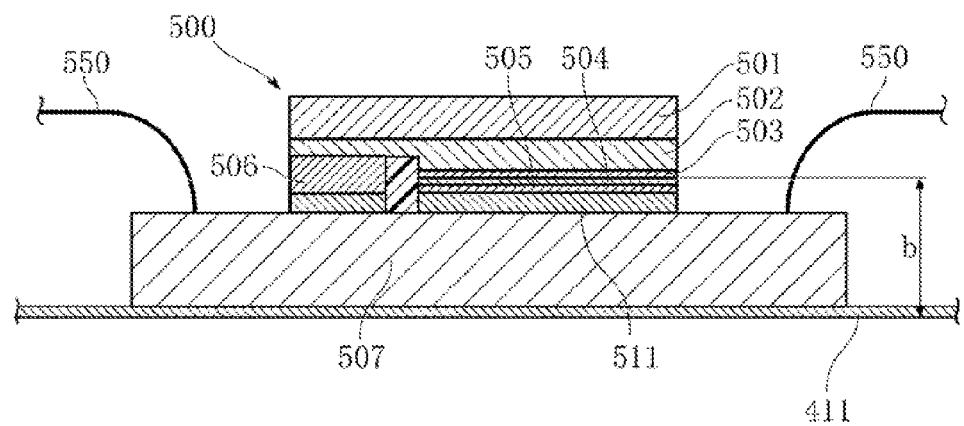
FIG. 22 is a sectional view illustrating an LED chip which is applied to the semiconductor light emitting device of FIG. 20.

In the present embodiment, as illustrated in FIG. 22, the LED chip 500, for example, is formed in a structure that includes a sub mount substrate 507 formed of Si and a semiconductor layer where a substrate 501, an n-type semiconductor layer 502, an active layer 503, and a p-type semiconductor layer 504 (for example, which are formed of GaN) are stacked, and emits blue light. In the semiconductor layer, an anode electrode 505 and a cathode electrode 506 are formed at the sub mount substrate 507 side. The anode electrode 505 and the cathode electrode 506 are connected to a wiring pattern (not shown) formed at the sub mount substrate 507 by a conductive paste 511. Two electrodes (not shown) are formed at the sub mount substrate 507. One end of each of two wires 550 is bonded to each of the electrodes. As illustrated in FIGS. 20 and 21, the other end of one wire 550 is bonded to an anode pad 411, and the other end of another wire 550 is bonded to a cathode pad 412.

A base member 300 is rectangular in shape, and a receiving concave portion 303 also is rectangular in. In the present embodiment, an inner wall surface 305 is inclined in a direction particular to a front surface 301. A reflective resin 710 covers a region other than a portion of the front surface 301 attached to the sub mount substrate 507 of the LED chip 500. An internal edge 712 of the reflective resin 710 contacts the sub mount substrate 507. The anode pad 411 has a planar dimension that occupies most portions of the receiving concave portion 303. A plurality of LED chips 500 is die-bonded to the anode pad 411. A Zener diode 600 and a wire 610 are covered by the reflective resin 710. Also, the bypass function element described in the present disclosure may be mounted on the sub mount substrate 507.

An anode side wiring 461 and a cathode side wiring 462 are formed at side surfaces of the base member 300. The anode side wiring 461 is connected to the anode pad 411 and an anode mounting electrode 431. The cathode side wiring 462 is connected to the cathode pad 412 and a cathode mounting electrode 432.

Using such a configuration, high luminance and miniaturization of the semiconductor light emitting device 102 can be realized. By covering most portions of the receiving concave portion 303 with the reflective resin 710, high luminance can be further facilitated. The sub mount substrate 507 protrudes from the front surface 301. Therefore, when forming the reflective resin 710, a resin material can be prevented from overflowing toward the active layer 503. Since the sub mount substrate 507 is not a part that emits light, high luminance of the semiconductor light emitting device 104 is not disturbed.

Moreover, as a modified example of the semiconductor light emitting device 104, the wirings 400 may be formed by a plate-shaped lead that is formed of Cu, Fe, or an alloy thereof. Specifically, the wirings 400 may use a lead having a part that corresponds to the cathode pad 412, the cathode side wiring 462, and the cathode mounting electrode 432, and a lead having a part that corresponds to the anode pad 411, the anode side wiring 461, and the anode mounting electrode 431. Also, in this modified example, a portion of the base member 300 configuring the inner wall surface 305 may be formed of a thermosetting resin or thermoplastic resin.

Figure 23:
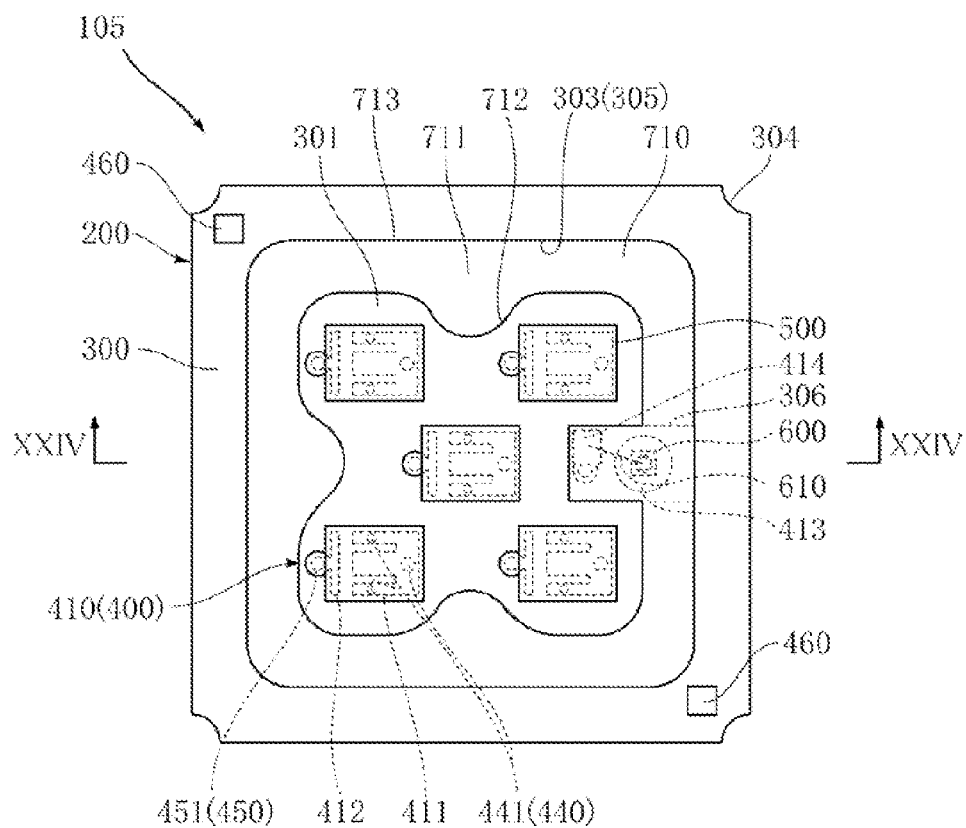
FIG. 23 is a plan view of a main part illustrating a semiconductor light emitting device according to a seventh embodiment of the present disclosure.
Figure 24:
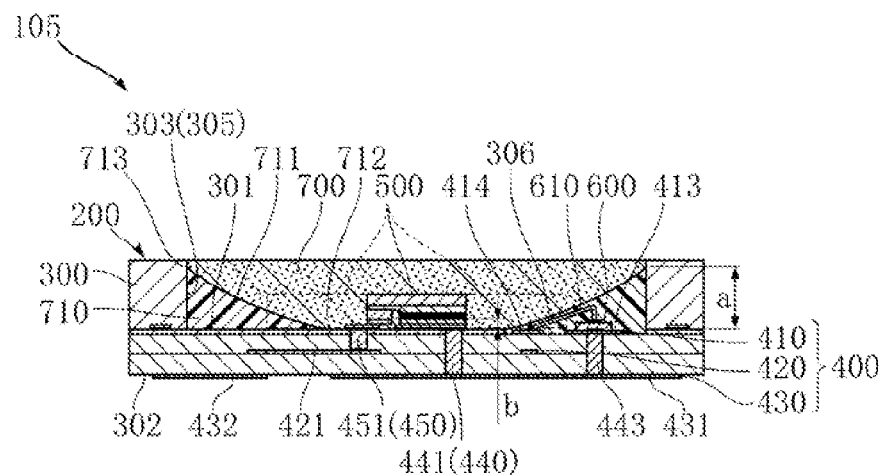
FIG. 24 is a sectional view taken along line XXIV-XXIV of FIG. 23.

A seventh embodiment of the present disclosure will be described below with reference to FIGS. 23 to 25.

Figure 25:
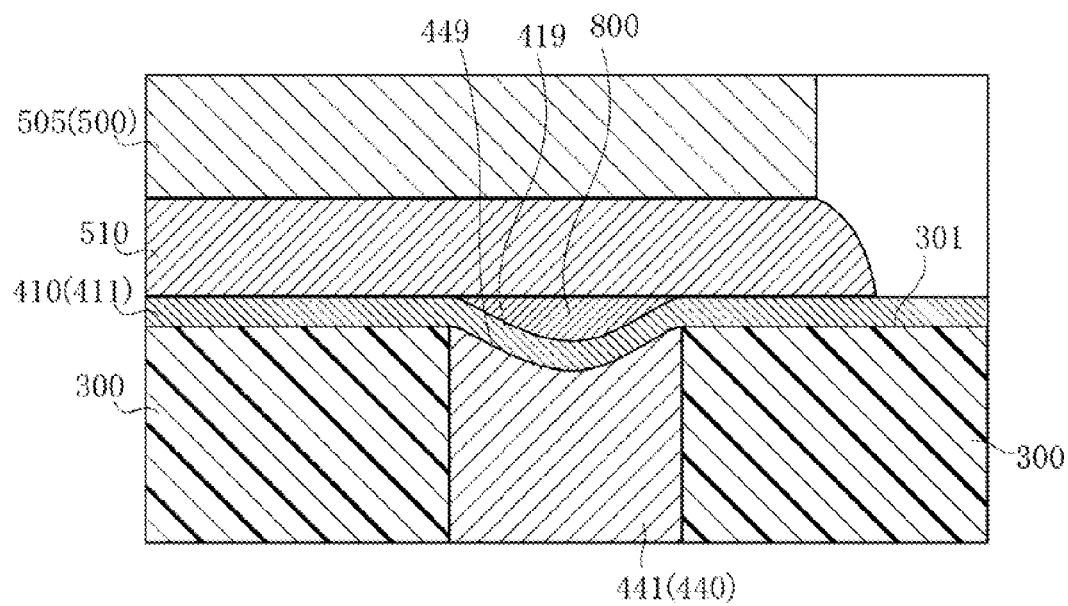
FIG. 25 is a partially enlarged sectional view illustrating an enlarged portion of the semiconductor light emitting device of FIG. 24.

A semiconductor light emitting device 105 of the same drawing differs from the semiconductor light emitting device 101 in that the former includes a filling part 800 of FIG. 25. A detailed description on this will be made below.

Although not explained in the description of the semiconductor light emitting device 101, actually, a concave portion recessed from the rear surface 302 of the base member 300 may be formed mainly at the anode through wiring 440 or at the cathode through wiring 450. The concave portion is formed in firing the base member 300. In FIG. 25, a concave portion 449 is illustrated to be formed at the full thickness anode through wiring 441 among the anode through wirings 440. In the present embodiment, as illustrated in FIGS. 23 and 24, the LED chips 500 are respectively disposed at a position overlapped with the full thickness anode through wiring 441.

Moreover, in the present embodiment, three full thickness anode through wirings 441 are formed at positions overlapped with one LED chip 500, but the number of the full thickness anode through wirings 441 overlapped with one LED chip 500 is not limited to three. The number of the full thickness anode through wirings 441 may be one, two, or four or more. As the number of the full thickness anode through wirings 441 increases, heat from the LED chip 500 can be more efficiently transferred to the anode mounting electrode 431. This can enhance the heat dissipation of the semiconductor light emitting device 105. Also, many full thickness anode through wirings 441 can decrease electric resistance between the front surface layer 410 (anode pad 411) and the anode mounting electrode 431.

A surface defining the concave portion 449 is covered by the front surface layer 410. The front surface layer 410 has an almost conformal thickness. Therefore, a concave portion 419 is formed even in the front surface layer 410. The concave portion 419 of FIG. 25 is formed at the anode pad 411 of the front surface layer 410. The concave portion 419 is recessed toward the rear surface 302 of the base member 300. The concave 419 overlaps with the concave portion 419 when seen in the thickness direction of the base member 3. Thus, in FIG. 25, the concave portion 419 is disposed just on the concave portion 449. Also, although not shown, in the present embodiment, the front surface layer 410 has a structure where a layer formed of Ni and a layer formed of Au are stacked. The layer formed of Ni is disposed between the layer formed of Au and the base member 300.

The concave portion 419 is filled with the filling part 800. The filling part 800 contacts the front surface layer 410 and the adhesive part 510. The filling part 800 may be formed of a conductive material or an insulating material. In the present embodiment, the filling part 800 is formed of a conductive material. As the conductive material forming the filling part 800, for example, an alloy of Au and Sn may be used. The filling part 800 is formed before disposing the LED chip 500 at the front surface layer 410 with the adhesive part 51. The filling part 800, for example, is formed by coating the concave portion 419 with a paste.

In the present embodiment, the adhesive part 510 is disposed between any one of the LED chips 500 and the front surface layer 410. The adhesive part 510 affixes each LED chip 50010 the front surface layer 410. The adhesive part 510 may be formed of a conductive material or an insulating material. In the present embodiment, the adhesive part 510 is formed of a conductive material. As the conductive material forming the adhesive part 510, for example, an alloy of Au and Sn may be used. Alternatively, the conductive material forming the adhesive part 510 may be a silver paste or soldering.

According to the semiconductor light emitting device 105, by forming the filling part 800 at the concave portion 419 before disposing the LED chip 500 at the base member 300, a surface of a portion for disposing the LED chip 500 can be better planarized. Therefore, even though the LED chip 500 is disposed at a position overlapped with the full thickness anode through wiring 441 when seen in the thickness direction of the base member 300, the LED chip 500 is not sunken into the concave portion 419, and thus the position of the LED chip 500 can be prevented from being changed when disposing the LED chip 500. Accordingly, the manufacturing yield of the semiconductor light emitting device 105 can be enhanced.

Figure 26:
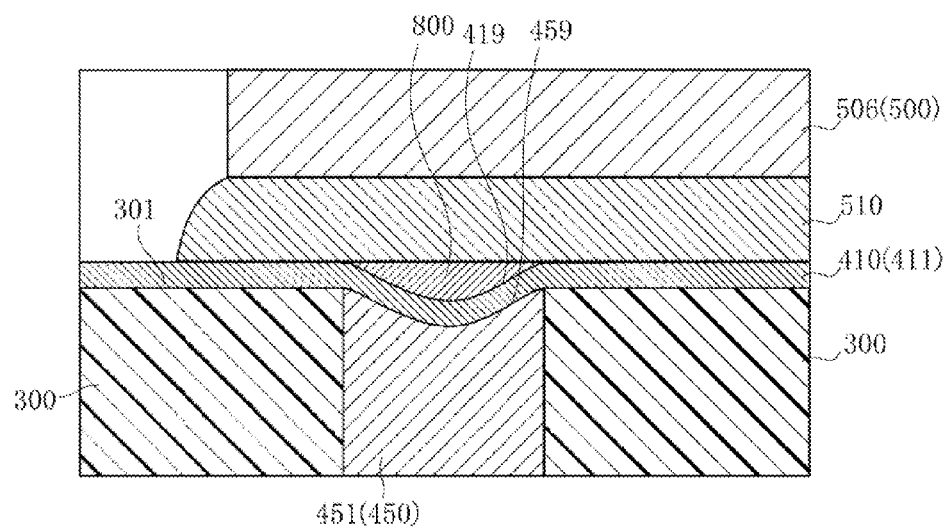
FIG. 26 is a partially enlarged sectional view of a semiconductor light emitting device according to a modified example of the seventh embodiment of the present disclosure.
Figure 27:
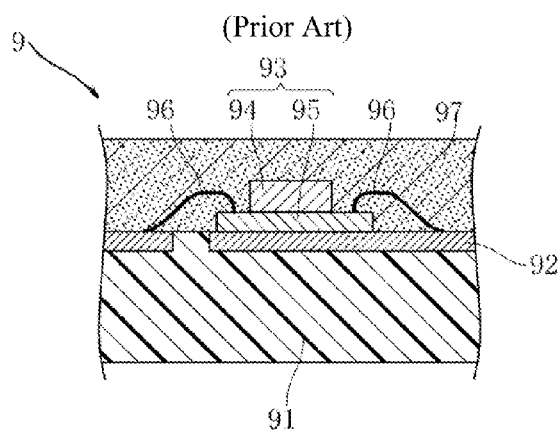
FIG. 27 is a sectional view of a main part illustrating an example of a conventional semiconductor light emitting device.
Figure 28:
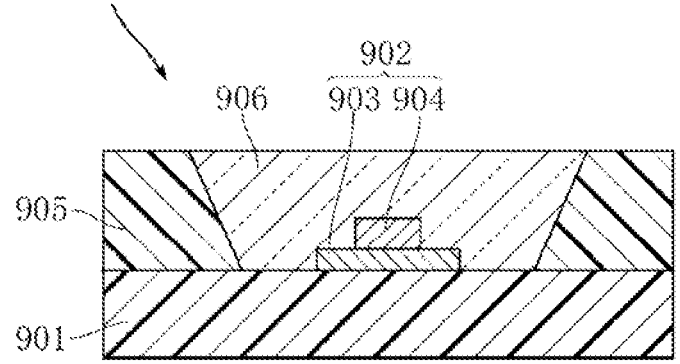
FIG. 28 is a sectional view illustrating an example of a conventional semiconductor light emitting device.

Moreover, in FIG. 25, an example is illustrated where the concave portion 449 is formed at the anode through wiring 440, and the concave portion 419 is formed at the anode pad 411 of the front surface layer 410. Unlike the configuration in FIG. 25, in FIG. 26, a case is also considered where a concave portion 459 is formed at the cathode through wiring 450, and the concave portion 419 is formed at a position overlapped with the concave portion 459 when seen in the thickness direction of the base member 300. In this case, the filling part 800 may be formed at the concave portion 419, and the LED chip 500 may be disposed at a position overlapped with the cathode through wiring 450 when seen in the thickness direction of the base member 300.

Moreover, the configuration of the semiconductor light emitting device 105 may be applied to the semiconductor light emitting device 102 or 103.

The semiconductor light emitting device according to the present disclosure is not limited to the above-described embodiments. The entire configuration of each part of the semiconductor light emitting device according to the present disclosure may be variously designed and changed.

The number of LED chips is not limited to five, but may be any arbitrary number.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor light emitting device, comprising:
a case including:
 a base member formed of ceramic, the base member including a front surface and a rear surface; and
 wirings including: a front surface layer including an anode pad and a cathode pad which are formed at the front surface; a rear surface layer including an anode mounting electrode and a cathode mounting electrode which are formed at the rear surface; an anode through wiring electrically connecting the anode pad and the anode mounting electrode and passing through at least a portion of the base member in a thickness direction of the base member; and a cathode through wiring electrically connecting the cathode pad and the cathode mounting electrode and passing through at least a portion of the base member in the thickness direction of the base member; and an LED chip mounted on the case, the LED chip including: a substrate; an n-type semiconductor layer; a p-type semiconductor layer; an active layer disposed between the n-type semiconductor layer and the p-type semiconductor layer; an anode electrode electrically connected to the p-type semiconductor; and a cathode electrode electrically connected to the n-type semiconductor, the n-type semiconductor layer, the active layer, and the p-type semiconductor layer being stacked on the substrate, and the anode electrode and the cathode electrode facing the case when the LED chip is mounted on the case.

2. The semiconductor light emitting device of claim 1, wherein the anode through wiring comprises a full thickness anode through wiring passing through the base member from the front surface to the rear surface.

3. The semiconductor light emitting device of claim 2, wherein the wirings comprise an intermediate layer disposed between the front surface and the rear surface in the thickness direction of the base member.

4. The semiconductor light emitting device of claim 3, wherein the cathode through wiring comprises: a surface side cathode through wiring passing through the base member from the front surface to the intermediate layer; and a rear surface side cathode through wiring passing through the base member from the intermediate layer to the rear surface.

5. The semiconductor light emitting device of claim 4, wherein the intermediate layer comprises a cathode relay wiring connected to the front surface side cathode through wiring and the rear surface side cathode through wiring.

6. The semiconductor light emitting device of claim 1, wherein the front surface layer comprises an anode plating wiring and a cathode plating wiring extended from one end of the base member to the other end of the base member, when seen in the thickness direction of the base member.

7. The semiconductor light emitting device of claim 6, wherein the anode through wiring comprises a plating anode through wiring connecting the anode plating wiring and the anode mounting electrode.

8. The semiconductor light emitting device of claim 6, wherein the cathode through wiring comprises a plating cathode through wiring connecting the cathode plating wiring and the cathode mounting electrode.

9. The semiconductor light emitting device of claim 1, wherein one end surface of the anode through wiring is exposed at the front surface and covered by the anode pad.

10. The semiconductor light emitting device of claim 9, wherein one end surface of the cathode through wiring is exposed at the front surface and covered by the cathode pad.

11. The semiconductor light emitting device of claim 10, wherein the other end surface of the anode through wiring is exposed at the rear surface and covered by the anode mounting electrode.

12. The semiconductor light emitting device of claim 11, wherein the other end surface of the cathode through wiring is exposed at the rear surface and covered by the cathode mounting electrode.

13. The semiconductor light emitting device of claim 1, wherein the anode through wiring and the cathode through wiring are formed of Ag.

14. The semiconductor light emitting device of claim 1, wherein the anode pad and the cathode pad are formed of Au.

15. The semiconductor light emitting device of claim 1, wherein the anode mounting electrode and the cathode mounting electrode are formed of Au.

16. The semiconductor light emitting device of claim 1, wherein,
the wirings comprise a bypass cathode pad and a bypass anode pad which are formed at the front surface,
the anode through wiring comprises a bypass cathode through wiring electrically connecting the bypass cathode pad and the anode mounting electrode, and
the cathode through wiring comprises a bypass anode through wiring electrically connecting the bypass anode pad and the cathode mounting electrode.

17. The semiconductor light emitting device of claim 16, further comprising,
a Zener diode electrically connected to the bypass cathode electrode, and
a wire electrically connecting the bypass anode pad and the Zener diode.

18. The semiconductor light emitting device of claim 1, wherein a receiving concave portion receiving the LED chip is formed in the case.

19. The semiconductor light emitting device of claim 18, wherein a sealing resin covering the LED chip is filled into the receiving concave portion.

20. The semiconductor light emitting device of claim 19, wherein the sealing resin is mixed with a phosphor material which is excited by light from the LED chip to emit light of a wavelength different from the light from the LED chip.

21. The semiconductor light emitting device of claim 1, wherein,
the case is approximately rectangular in shape when seen in a thickness direction of the base member, and
a corner concave portion is formed at each of four corners of the case, the corner concave portion having a quarter round sectional shape when seen in the thickness direction of the base member.

22. The semiconductor light emitting device of claim 1, further comprising:
a first concave portion formed in at least one of the anode through wiring and the cathode through wiring;
a second concave portion formed at the front surface layer to overlap with the first concave portion, when seen in the thickness direction of the base member; and
a filling part filled into the second concave portion,
wherein the filling part overlaps with the LED chip when seen in the thickness direction of the base member.

* * * * *